US008685542B2

(12) United States Patent
Kim et al.

(10) Patent No.: US 8,685,542 B2
(45) Date of Patent: Apr. 1, 2014

(54) ORGANIC LIGHT-EMITTING DEVICE

(75) Inventors: Hee-Yeon Kim, Yongin (KR); Seung-Gak Yang, Yongin-si (KR); Yoon-Hyun Kwak, Yongin (KR); Jeoung-In Yi, Yongin (KR); Jae-Yong Lee, Yongin (KR); Jong-Hyuk Lee, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 413 days.

(21) Appl. No.: 13/064,562

(22) Filed: Mar. 31, 2011

(65) Prior Publication Data

US 2011/0240968 A1 Oct. 6, 2011

(30) Foreign Application Priority Data

Apr. 1, 2010 (KR) ........................ 10-2010-0029994

(51) Int. Cl.
*H01L 51/54* (2006.01)

(52) U.S. Cl.
USPC ........... 428/690; 428/917; 313/504; 313/506; 313/512

(58) Field of Classification Search
None
See application file for complete search history.

(56) References Cited

U.S. PATENT DOCUMENTS 7,456,424 B2 11/2008 Wu et al.
2005/0116636 A1* 6/2005 Kang ............................ 313/512
2006/0033115 A1* 2/2006 Blochwitz et al. .............. 257/94
2006/0214155 A1* 9/2006 Ong et al. ....................... 257/40
2008/0014464 A1 1/2008 Kawamura et al.
2008/0023724 A1 1/2008 Takeda et al.
2008/0124572 A1 5/2008 Mizuki et al.
2009/0066225 A1 3/2009 Kimura et al.
2009/0295276 A1 12/2009 Asari et al.
2010/0187977 A1 7/2010 Kai et al.

FOREIGN PATENT DOCUMENTS

EP 0 906 947 A1 4/1999
EP 2 080 762 A1 7/2009
KR 10-2007-0019220 A 2/2007
KR 10-2007-0110371 A 11/2007

(Continued)

OTHER PUBLICATIONS

Korean Notice of Allowance in KR 10-2010-0029994, dated Aug. 31, 2012 (Kim, et al.).

*Primary Examiner* — Dawn L. Garrett
(74) *Attorney, Agent, or Firm* — Lee & Morse, P.C.

(57) ABSTRACT

An organic light-emitting device including a substrate; a first electrode on the substrate, the first electrode including a first surface and a second surface opposite to the first surface; an organic layer on the first electrode, the organic layer being adjacent to the first surface of the first electrode; a second electrode on the organic layer, the second electrode including a first surface adjacent to the organic layer and a second surface opposite to the first surface; and a luminescent efficiency improvement layer on at least one of the second surface of the first electrode and the second surface of the second electrode, the luminescent efficiency improvement layer including a condensed-cyclic compound represented by Formula 1, below:

Formula 1

$R_2$, $R_1$, $R_3$, $C_1$, $R_4$, $C_2$, A, $R_5$

19 Claims, 2 Drawing Sheets

10
18
17B
17
17A
15
13B
13
13A
11

(56) References Cited

FOREIGN PATENT DOCUMENTS

| | | | |
|---|---|---|---|
| KR | 10-2008-0085000 | A | 9/2008 |
| KR | 10-2009-0021174 | A | 2/2009 |
| KR | 10-0883306 | B1 | 2/2009 |
| KR | 10-2009-0035729 | A | 4/2009 |
| KR | 10-2009-0086057 | A | 8/2009 |
| WO | WO 2007/063796 | A1 | 6/2007 |

* cited by examiner

ORGANIC LIGHT-EMITTING DEVICE

BACKGROUND OF THE INVENTION

1. Field

Embodiments relate to an organic light-emitting device.

2. Description of the Related Art

Organic light-emitting devices (OLEDs), which are self-emitting devices, have advantages such as a wide viewing angle, excellent contrast, quick response, high brightness, and excellent driving voltage characteristics, and can provide multicolored images.

A typical OLED has a structure including, e.g., a substrate, and an anode, a hole transport layer (HTL), an emission layer (EML), an electron transport layer (ETL), and a cathode, which are sequentially stacked on the substrate. In this regard, the HTL, the EML, and the ETL may be organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

Luminescent efficiency of an OLED may be categorized into internal luminescent efficiency and external luminescent efficiency. Internal luminescent efficiency is influenced by how efficiently excitons are generated and converted into light in organic layers such as the HTL, EML, and ETL, which are interposed between a first electrode and a second electrode (i.e., between the anode and the cathode). On the other hand, external luminescent efficiency (light coupling efficiency) is influenced by how efficiently light generated in the organic layers is extracted out of the OLED.

SUMMARY

Embodiments are directed to an organic light-emitting device, which substantially overcome one or more of the problems due to the limitations and disadvantages of the related art.

It is a feature of an embodiment to provide an organic light-emitting device including a luminescent efficiency improvement layer.

At least one of the above and other features and advantages may be realized by providing an organic light-emitting device including a substrate; a first electrode on the substrate, the first electrode including a first surface and a second surface opposite to the first surface; an organic layer on the first electrode, the organic layer being adjacent to the first surface of the first electrode; a second electrode on the organic layer, the second electrode including a first surface adjacent to the organic layer and a second surface opposite to the first surface; and a luminescent efficiency improvement layer on at least one of the second surface of the first electrode and the second surface of the second electrode, the luminescent efficiency improvement layer including a condensed-cyclic compound represented by Formula 1, below:

Formula 1

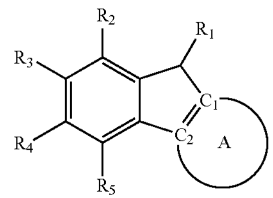

wherein, in Formula 1, ring A is represented by Formula 2 or 3 below:

Formula 2

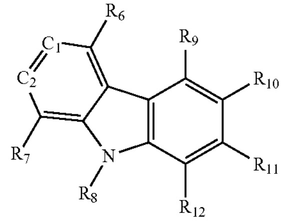

Formula 3

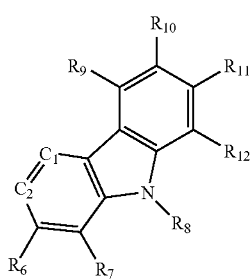

wherein, in Formulae 1 to 3, $R_1$ through $R_{12}$ are each independently a hydrogen atom, a heavy hydrogen (deuterium), a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a first substituent represented by —$(Ar_1)$a-$Ar_{11}$, a second substituent represented by —N[—$(Ar_2)_b$—$Ar_{12}$][—$(Ar_3)_c$—$Ar_{13}$], or a third substituent represented by —$(Ar_4)_d$—N[—$(Ar_5)_e$—$Ar_{15}$][—$(Ar_6)$f-$Ar_{16}$]; $Ar_1$ through $Ar_6$, among the first to third substituents, are each independently a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, or a substituted or unsubstituted $C_3$-$C_{30}$ heteroarylene group; $Ar_{11}$, $Ar_{12}$, $Ar_{13}$, $Ar_{15}$, and $Ar_{16}$, among the first to third substituents, are each independently a hydrogen atom, a heavy hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_5$-$C_{30}$ aryl group, or a substituted or unsubstituted $C_3$-$C_{30}$ heteroaryl group; a, b, c, e, and f are each independently an integer from 0 to 10. d is an integer from 1 to 10; and a groups of $Ar_1$ in the group of —$(Ar_1)_a$—$Ar_{11}$ are identical to or different from each other; b groups of $Ar_2$ in the group of —$(Ar_2)_b$—$Ar_{12}$ are identical to or different from each other; c groups of $Ar_3$ in the group of —$(Ar_3)_c$—$Ar_{13}$ are identical to or different from each other; e groups of Ar5 in the group of —$(Ar_5)_e$—$Ar_{15}$ are identical to or different from each other; and f groups of $Ar_6$ in the group of —$(Ar_6)_f$—$Ar_{16}$ are identical to or different from each other.

$Ar_1$ through $Ar_6$ may each independently be a substituted or unsubstituted $C_5$-$C_{14}$ arylene group or a substituted or unsubstituted $C_3$-$C_{14}$ heteroarylene group.

$Ar_1$ through $Ar_6$ may each independently be a phenylene group, a $C_1$-$C_{10}$ alkylphenylene group, a di($C_1$-$C_{10}$ alkyl) phenylene group, a ($C_6$-$C_{14}$ aryl)phenylene group, a di($C_6$-$C_{14}$ aryl)phenylene group, a carbazolylene group, a $C_1$-$C_{10}$ alkylcarbazolylene group, a di($C_1$-$C_{10}$ alkyl)carbazolylene group, a $C_6$-$C_{14}$ arylcarbazolylene group, a di($C_6$-$C_{14}$ aryl) carbazolylene group, a fluorenylene group, a $C_1$-$C_{10}$ alkylfluorenylene group, a di($C_1$-$C_{10}$ alkyl)fluorenylene group, a ($C_6$-$C_{14}$ aryl)fluorenylene group, a di($C_6$-$C_{14}$ aryl)fluorenylene group, a naphthylene group, a $C_1$-$C_{10}$ alkylnaphthylene group, a di($C_1$-$C_{10}$ alkyl)naphthylene group, a ($C_6$-$C_{14}$ aryl)naphthylene group, a di($C_6$-$C_{14}$ aryl)naphthylene group, an anthrylene group, a $C_1$-$C_{10}$ alkylanthrylene group, a di($C_1$-$C_{10}$ alkyl)nthrylene group, a ($C_6$-$C_{14}$ aryl)nthrylene group, a di($C_6$-$C_{14}$ aryl)nthrylene group, a pyridinylene group, a $C_1$-$C_{10}$ alkylpyridinylene group, a di($C_1$-$C_{10}$ alkyl)pyridinylene group, a ($C_6$-$C_{14}$ aryl)pyridinylene group, a di($C_6$-$C_{14}$ aryl)pyridinylene group, a quinolinylene group, a $C_1$-$C_{10}$ alkylquinolinylene group, a di($C_1$-$C_{10}$ alkyl)quinolinylene group, a ($C_6$-$C_{14}$ aryl)quinolinylene group, a di($C_6$-$C_{14}$ aryl) quinolinylene group, a benzoimidazolylene group, a $C_1$-$C_{10}$ alkylbenzoimidazolylene group, a di($C_1$-$C_{10}$ alkyl)benzoimidazolylene group, a ($C_6$-$C_{14}$ aryl)benzoimidazolylene group, a di($C_6$-$C_{14}$ aryl)benzoimidazolylene group, an imidazopyridinylene group, a $C_1$-$C_{10}$ alkylimidazopyridinylene group, a di($C_1$-$C_{10}$ alkyl)imidazopyridinylene group, a ($C_6$-$C_{14}$ aryl) imidazopyridinylene group, a di($C_6$-$C_{14}$aryl)imidazopyridinylene group, an imidazopyrimidinylene group, a $C_1$-$C_{10}$ alkylimidazopyrimidinylene group, a di($C_1$-$C_{10}$ alkyl) imidazopyrimidinylene group, a ($C_6$-$C_{14}$ aryl)imidazopyrimidinylene group, or a di($C_6$-$C_{14}$ aryl)imidazopyrimidinylene group.

$Ar_{11}$, $Ar_{12}$, $Ar_{13}$, $Ar_{15}$, and $Ar_{16}$ may each independently be a hydrogen atom, a heavy hydrogen, a halogen atom, a hydroxyl group, a cyano group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_5$-$C_{14}$ aryl group, or a substituted or unsubstituted $C_3$-$C_{14}$ heteroaryl group.

$Ar_{11}$, $Ar_{12}$, $Ar_{13}$, $Ar_{15}$, and $Ar_{16}$ may each independently be a hydrogen atom, a heavy hydrogen, a halogen atom, a hydroxyl group, a cyano group, a methyl group, an ethyl group, a propyl group, a butyl group, a pentyl group, an ethenyl group, a propenyl group, a butenyl group, a pentenyl group, an acetyl group, a methoxy group, an ethoxy group, a propoxy group, a butoxy group, a pentoxy group, a phenyl group, a $C_1$-$C_{10}$ alkyl phenyl group, a di($C_1$-$C_{10}$ alkyl)phenyl group, a ($C_6$-$C_{14}$ aryl)phenyl group, a di($C_6$-$C_{14}$ aryl)phenyl group, a carbazolyl group, a $C_1$-$C_{10}$alkylcarbazolyl group, a di($C_1$-$C_{10}$ alkyl)carbazolyl group, a $C_6$-$C_{14}$ arylcarbazolyl group, a di($C_6$-$C_{14}$ aryl)carbazolyl group, a fluorenyl group, a $C_1$-$C_{10}$ alkylfluorenyl group, a di($C_1$-$C_{10}$ alkyl)fluorenyl group, a ($C_6$-$C_{14}$ aryl)fluorenyl group, a di($C_6$-$C_{14}$ aryl)fluorenyl group, a naphthyl group, a $C_1$-$C_{10}$ alkylnaphthyl group, a di($C_1$-$C_{10}$ alkyl)naphthyl group, a ($C_6$-$C_{14}$ aryl)naphthyl group, a di($C_6$-$C_{14}$ aryl)naphthyl group, an anthryl group, a $C_1$-$C_{10}$ alkylanthryl group, a di($C_1$-$C_{10}$ alkyl)anthryl group, a ($C_6$-$C_{14}$ aryl)anthryl group, a di($C_6$-$C_{14}$ aryl)anthryl group, a pyridinyl group, a $C_1$-$C_{10}$ alkylpyridinyl group, a di($C_1$-$C_{10}$ alkyl)pyridinyl group, a ($C_6$-$C_{14}$ aryl)pyridinyl group, a di($C_6$-$C_{14}$ aryl)pyridinyl group, a quinolinyl group, a $C_1$-$C_{10}$ alkylquinolinyl group, a di($C_1$-$C_{10}$ alkyl)quinolinyl group, a ($C_6$-$C_{14}$ aryl)quinolinyl group, a di($C_6$-$C_{14}$ aryl)quinolinyl group, a benzoimidazolyl group, a $C_1$-$C_{10}$ alkylbenzoimidazolyl group, a di($C_1$-$C_{10}$ alkyl)benzoimidazolyl group, a ($C_6$-$C_{14}$ aryl)benzoimidazolyl group, a di($C_6$-$C_{14}$ aryl)benzoimidazolyl group, an imidazopyridinyl group, a $C_1$-$C_{10}$ alkylimidazopyridinyl group, a di($C_1$-$C_{10}$ alkyl) imidazopyridinyl group, a ($C_6$-$C_{14}$ aryl) imidazopyridinyl group, a di($C_6$-$C_{14}$ aryl) imidazopyridinyl group, an imidazopyrimidinyl group, a $C_1$-$C_{10}$ alkylimidazopyrimidinyl group, a di($C_1$-$C_{10}$ alkyl) imidazopyrimidinyl group, a ($C_6$-$C_{14}$ aryl) imidazopyrimidinyl group, or a di($C_6$-$C_{14}$ aryl) imidazopyrimidinyl group.

$Ar_{11}$, $Ar_{12}$, $Ar_{13}$, $Ar_{15}$, and $Ar_{16}$ may each independently be represented by any one of Formulae 4A through 4G below:

Formula 4A

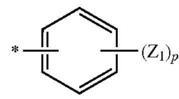

Formula 4B

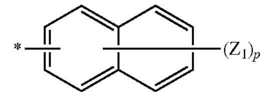

Formula 4C

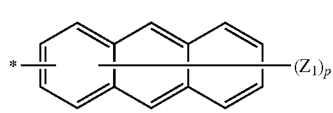

Formula 4D

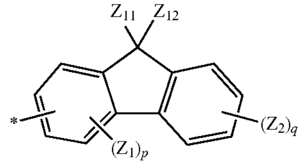

Formula 4E

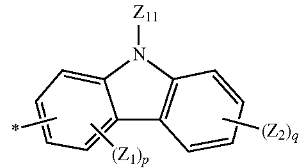

Formula 4F

Formula 4G

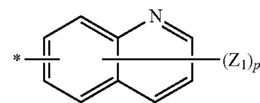

wherein, in Formulae 4A to 4G $Z_1$, $Z_2$, $Z_{11}$, and $Z_{12}$ are each independently a hydrogen atom, a heavy hydrogen, a $C_1$-$C_{10}$ alkyl group, a $C_1$-$C_{10}$ alkoxy group, or a $C_6$-$C_{14}$ aryl group; p and q are each independently an integer from 1 to 8; and * denotes a binding site with $Ar_1$, $Ar_2$, $Ar_3$, $Ar_5$, or $Ar_6$.

$Ar_{11}$, $Ar_{12}$, $Ar_{13}$, $Ar_{15}$, and $Ar_{16}$ may each independently be represented by any one of Formulae 5A through 5E below:

Formula 5A

Formula 5B

Formula 5C

Formula 5D

Formula 5E

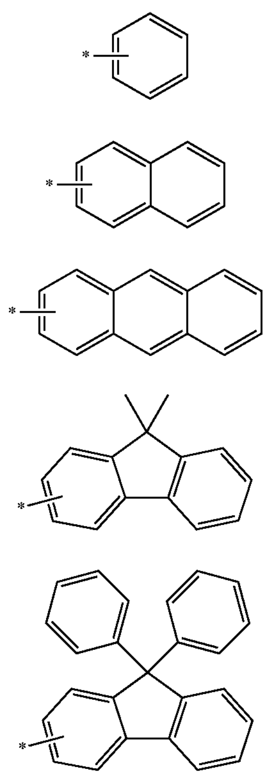

wherein * is a binding site with $Ar_1$, $Ar_2$, $Ar_3$, $Ar_5$, or $Ar_6$.

a, b, c, e, and f may each independently be 0, 1, 2, or 3.

d may be 1, 2, or 3.

The second substituent and $—N[Ar_5)_e—Ar_{15}][—(Ar_6)_f—Ar_{16}]$ of the third substituent may each independently be represented by any one of Formulae 6A through 6K below:

Formula 6A

Formula 6B

-continued

Formula 6C

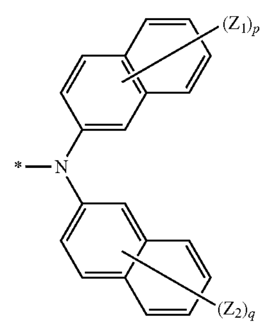

Formula 6D

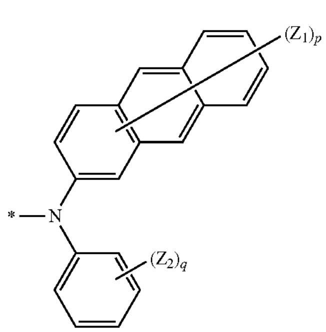

Formula 6E

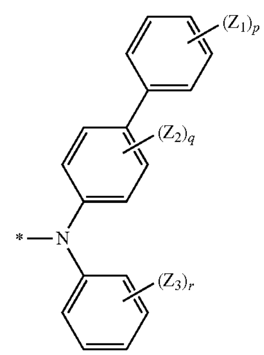

Formula 6F

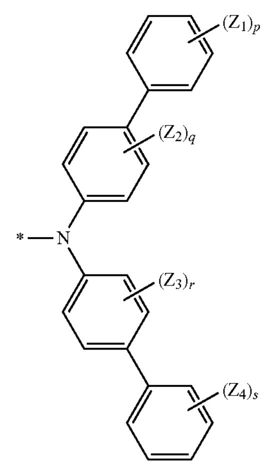

-continued

Formula 6G

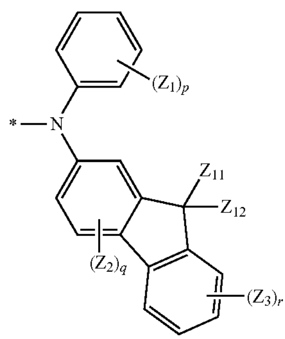

Formula 6H

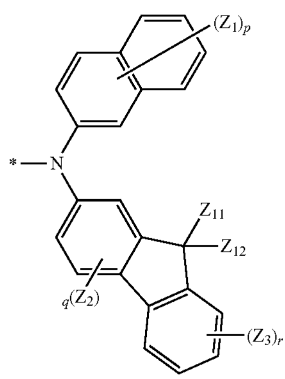

Formula 6I

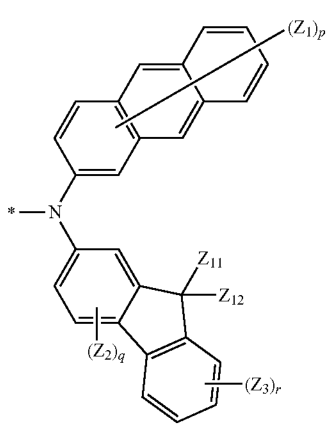

Formula 6J

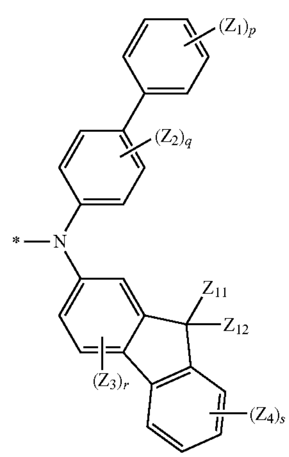

-continued

Formula 6K

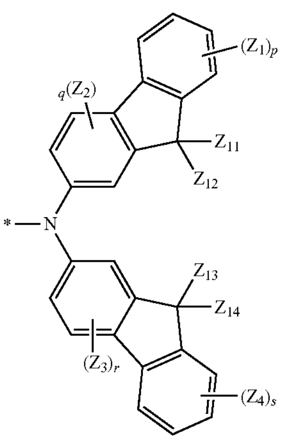

wherein, in Formulae 6A to 6K $Z_1$ through $Z_4$ and $Z_{11}$ through $Z_{14}$ are each independently a hydrogen atom, a heavy hydrogen, a $C_1$-$C_{10}$ alkyl group, a $C_1$-$C_{10}$ alkoxy group, or a $C_6$-$C_{14}$ aryl group; p, q, r, and s are each independently an integer from 1 to 8; and * denotes a binding site with $Ar_4$ or with a ring atom of a backbone of Formula 1.

$R_1$ through $R_{12}$ may each independently be a hydrogen atom, a heavy hydrogen, a halogen atom, a hydroxyl group, a cyano group, the first substituent, the second substituent, or the third substituent; a in the first substituent may be 0; b and c in the second substituent may each independently be 0 or 1; d in the third substituent may be 1 or 2, e and f in the third substituent may each independently be 0 or 1; $Ar_2$ through $Ar_6$ in the first to third substituents may each independently be a substituted or unsubstituted $C_5$-$C_{14}$arylene group or a substituted or unsubstituted $C_3$-$C_{14}$heteroarylene group; and $Ar_{11}$, $Ar_{12}$, $Ar_{13}$, $Ar_{15}$, and $Ar_{16}$ in the first to third substituents may each independently be a hydrogen atom, a heavy hydrogen, a halogen atom, a hydroxyl group, a cyano group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_5$-$C_{14}$ aryl group, or a substituted or unsubstituted $C_3$-$C_{14}$ heteroaryl group.

$R_1$ through $R_{12}$ may each independently be a hydrogen atom, a heavy hydrogen, a halogen atom, a hydroxyl group, a cyano group, the first substituent, the second substituent, or the third substituent; a in the first substituent may be 0; b and c in the second substituent may each independently be 0 or 1; d in the third substituent may be 1 or 2, and e and f in the third substituent may each independently be 0 or 1; $Ar_2$ through $Ar_6$ in the first to third substituents may each independently be a phenylene group, a $C_1$-$C_{10}$ alkylphenylene group, a di($C_1$-$C_{10}$ alkyl)phenylene group, a ($C_6$-$C_{14}$aryl)phenylene group, a di($C_6$-$C_{14}$aryl)phenylene group, a carbazolylene group, a $C_1$-$C_{10}$alkylcarbazolylene group, a di($C_1$-$C_{10}$alkyl)carbazolylene group, a $C_6$-$C_{14}$arylcarbazolylene group, a di($C_6$-$C_{14}$aryl)carbazolylene group, a fluorenylene group, a $C_1$-$C_{10}$alkylfluorenylene group, a di($C_1$-$C_{10}$alkyl)fluorenylene group, a ($C_6$-$C_{14}$aryl)fluorenylene group, a di($C_6$-$C_{14}$aryl)fluorenylene group, a naphthylene group, a $C_1$-$C_{10}$alkylnaphthylene group, a di($C_1$-$C_{10}$alkyl)naphthylene group, a ($C_6$-$C_{14}$aryl)naphthylene group, a di($C_6$-$C_{14}$aryl)naphthylene group, an anthrylene group, a $C_1$-$C_{10}$alkylanthrylene group, a di($C_1$-$C_{10}$alkyl)nthrylene group, a ($C_6$-$C_{14}$aryl)nthrylene group, a di($C_6$-$C_{14}$aryl) nthrylene group, a pyridinylene group, a $C_1$-$C_{10}$alkylpyridinylene group, a di($C_1$-$C_{10}$alkyl)pyridinylene group, a ($C_6$-$C_{14}$aryl)pyridinylene group, a di($C_6$-$C_{14}$aryl)pyridinylene group, a quinolinylene group, a $C_1$-$C_{10}$alkylquinolinylene group, a di($C_1$-$C_{10}$alkyl)quinolinylene group, a ($C_6$-$C_{14}$aryl)quinolinylene group, a di($C_6$-$C_{14}$aryl)quinolinylene group, a benzoimidazolylene group, a $C_1$-$C_{10}$alkylbenzoimidazolylene group, a di($C_1$-$C_{10}$alkyl) benzoimidazolylene group, a ($C_6$-$C_{14}$aryl)benzoimidazolylene group, a di($C_6$-$C_{14}$aryl)benzoimidazolylene group, an imidazopyridinylene group, a $C_1$-$C_{10}$alkylimidazopyridinylene group, a di($C_1$-$C_{10}$alkyl) imidazopyridinylene group, a ($C_6$-$C_{14}$aryl) imidazopyridinylene group, a di($C_6$-$C_{14}$aryl) imidazopyridinylene group, an imidazopyrimidinylene group, a $C_1$-$C_{10}$alkylimidazopyrimidinylene group, a di($C_1$-$C_{10}$alkyl) imidazopyrimidinylene group, a ($C_6$-$C_{14}$aryl) imidazopyrimidinylene group, or a di($C_6$-$C_{14}$aryl) imidazopyrimidinylene group; $Ar_{11}$, $Ar_{12}$, $Ar_{13}$, $Ar_{15}$, and $Ar_{16}$ in the first to third substituents may each independently be a hydrogen atom, a heavy hydrogen, a halogen atom, a hydroxyl group, a cyano group, a methyl group, an ethyl group, a propyl group, a butyl group, a pentyl group, an ethenyl group, a propenyl group, a butenyl group, a pentenyl group, an acetyl group, a methoxy group, an ethoxy group, a propoxy group, a butoxy group, a pentoxy group, a phenyl group, $C_1$-$C_{10}$alkyla phenyl group, a di($C_1$-$C_{10}$alkyl)phenyl group, a ($C_6$-$C_{14}$aryl)phenyl group, a di($C_6$-$C_{14}$aryl)phenyl group, a carbazolyl group, a $C_1$-$C_{10}$alkylcarbazolyl group, a di($C_1$-$C_{10}$alkyl)carbazolyl group, a $C_6$-$C_{14}$arylcarbazolyl group, a di($C_6$-$C_{14}$aryl)carbazolyl group, a fluorenyl group, a $C_1$-$C_{10}$alkylfluorenyl group, di($C_1$-$C_{10}$alkyl)fluorenyl group, a ($C_6$-$C_{14}$aryl)fluorenyl group, a di($C_6$-$C_{14}$aryl)fluorenyl group, a naphthyl group, a $C_1$-$C_{10}$alkylnaphthyl group, a di($C_1$-$C_{10}$alkyl)naphthyl group, a ($C_6$-$C_{14}$aryl)naphthyl group, a di($C_6$-$C_{14}$aryl)naphthyl group, an anthryl group, a $C_1$-$C_{10}$alkylanthryl group, a di($C_1$-$C_{10}$alkyl)anthryl group, a ($C_6$-$C_{14}$aryl)anthryl group, a di($C_6$-$C_{14}$aryl)anthryl group, a pyridinyl group, a $C_1$-$C_{10}$alkylpyridinyl group, a di($C_1$-$C_{10}$alkyl)pyridinyl group, a ($C_6$-$C_{14}$aryl)pyridinyl group, a di($C_6$-$C_{14}$aryl)pyridinyl group, a quinolinyl group, a $C_1$-$C_{10}$alkylquinolinyl group, a di($C_1$-$C_{10}$alkyl)quinolinyl group, a ($C_6$-$C_{14}$aryl) quinolinyl group, a di($C_6$-$C_{14}$aryl)quinolinyl group, a benzoimidazolyl group, a $C_1$-$C_{10}$alkylbenzoimidazolyl group, a di($C_1$-$C_{10}$alkyl)benzoimidazolyl group, a ($C_6$-$C_{14}$aryl)benzoimidazolyl group, a di($C_6$-$C_{14}$aryl)benzoimidazolyl group, an imidazopyridinyl group, a $C_1$-$C_{10}$alkylimidazopyridinyl group, a di($C_1$-$C_{10}$alkyl) imidazopyridinyl group, a ($C_6$-$C_{14}$aryl) imidazopyridinyl group, a di($C_6$-$C_{14}$aryl) imidazopyridinyl group, an imidazopyrimidinyl group, a $C_1$-$C_{10}$alkylimidazopyrimidinyl group, a di($C_1$-$C_{10}$alkyl) imidazopyrimidinyl group, a ($C_6$-$C_{14}$aryl) imidazopyrimidinyl group, or a di($C_6$-$C_{14}$aryl) imidazopyrimidinyl group.

The condensed-cyclic compound represented by Formula 1 may be represented by any one of Formulae 2a through 2d below:

Formula 2a

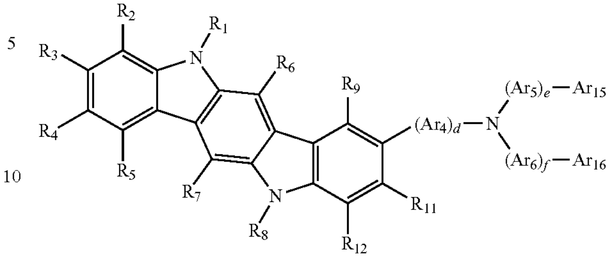

Formula 2b

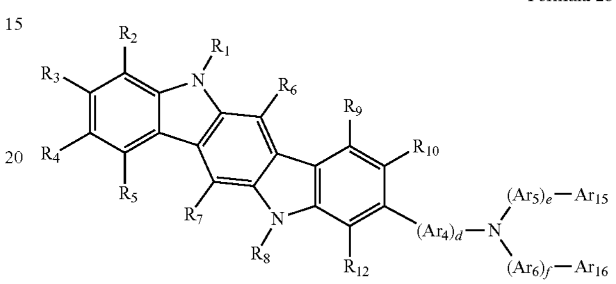

Formula 2c

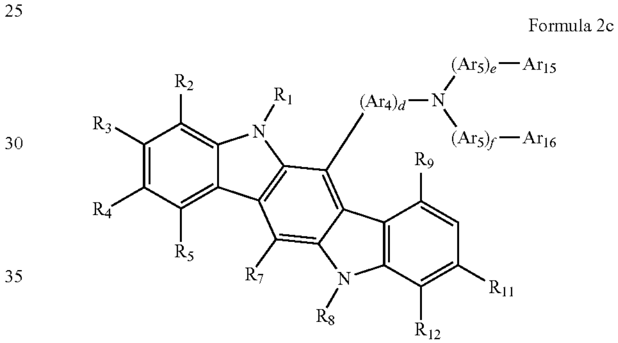

Formula 2d

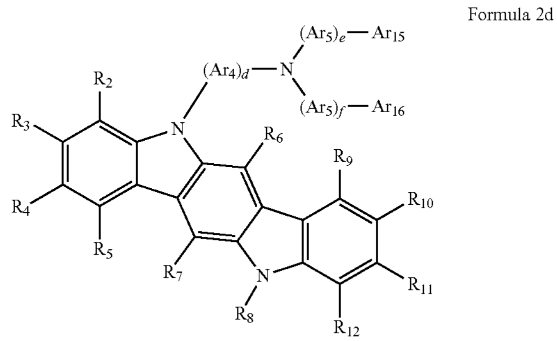

wherein, in Formulae 2a to 2d, $R_1$ through $R_{12}$ are each independently a hydrogen atom, a heavy hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, the first substituent, the second substituent, or the third substituent; $Ar_1$ through $Ar_6$, among the first to third substituents, are each independently a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, or a substituted or unsubstituted $C_3$-$C_{30}$ heteroarylene group; $Ar_{11}$, $Ar_{12}$, $Ar_{13}$, $Ar_{15}$, and $Ar_{16}$, among the first to third substituents, are each independently a hydrogen atom, a heavy hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_5$-$C_{30}$ aryl group, or a substituted or unsubstituted $C_3$-$C_{30}$ heteroaryl group; a, b, c, e, and f are each independently an integer from 0 to 10; d is an integer from 1 to 10; and a groups of $Ar_1$ in the group of —$(Ar_f)_a$—$Ar_{11}$ are identical to or different from each other; b groups of $Ar_2$ in the group of —$(Ar_2)_b$—$Ar_{12}$ are identical to or different from each other; c groups of $Ar_3$ in the group of —$(Ar_3)_c$—$Ar_{13}$ are identical to or different from each other; e groups of $Ar_5$ in the group of —$(Ar_5)_e$—$Ar_{15}$ are identical to or different from each other; and f groups of $Ar_6$ in the group of —$(Ar_6)_f$—$Ar_{16}$ are identical to or different from each other.

The condensed-cyclic compound represented by Formula 1 may be represented by any one of Formulae 3a through 3e below:

Formula 3a

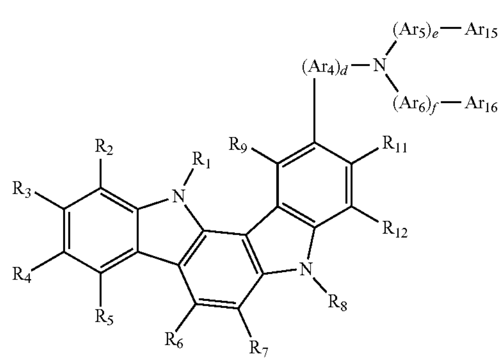

Formula 3b

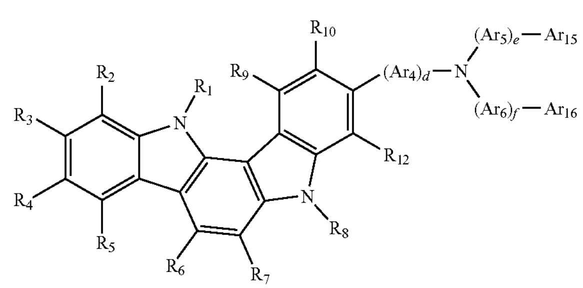

Formula 3c

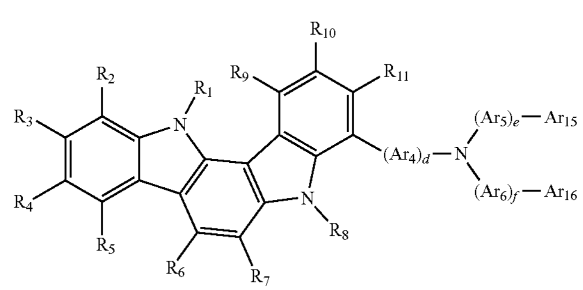

-continued

Formula 3d

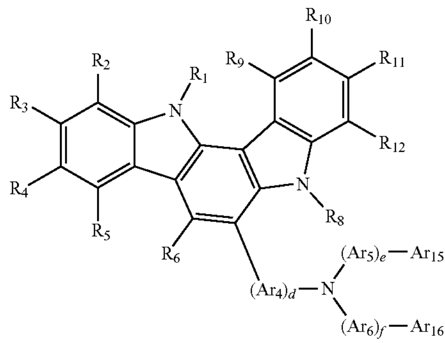

Formula 3e

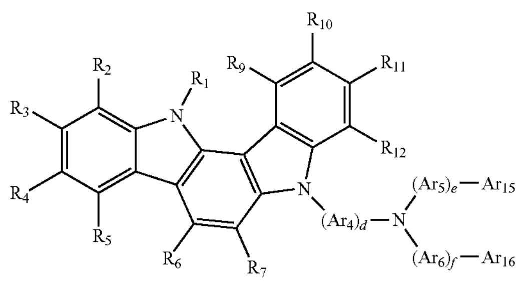

wherein, in Formulae 3a to 3e, $R_1$ through $R_{12}$ are each independently a hydrogen atom, a heavy hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, the first substituent, the second substituent, or the third substituent; $Ar_1$ through $Ar_6$, among the first to third substituents, are each independently a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, or a substituted or unsubstituted $C_3$-$C_{30}$ heteroarylene group; $Ar_{11}$, $Ar_{12}$, $Ar_{13}$, $Ar_{15}$, and $Ar_{16}$, among the first to third substituents, are each independently a hydrogen atom, a heavy hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_5$-$C_{30}$ aryl group, or a substituted or unsubstituted $C_3$-$C_{30}$ heteroaryl group; a, b, c, e, and f are each independently an integer from 0 to 10; d is an integer from 1 to 10; and a groups of $Ar_1$ in the group of —$(Ar_1)_a$—$Ar_{11}$ are identical to or different from each other; b groups of $Ar_2$ in the group of —$(Ar_2)_b$—$Ar_{12}$ are identical to or different from each other; c groups of $Ar_3$ in the group of —$(Ar_3)_c$—$Ar_{13}$ are identical to or different from each other; e groups of $Ar_5$ in the group of —$(Ar_5)_e$—$Ar_{15}$ are identical to or different from each other; and f groups of $Ar_6$ in the group of —$(Ar_6)_f$—$Ar_{16}$ are identical to or different from each other.

The second electrode may be a transmission electrode, and the luminescent efficiency improvement layer may be disposed over the second surface of the second electrode, the second electrode being between the organic layer and the luminescent efficiency improvement layer.

The first electrode may be a transmission electrode, and the luminescent efficiency improvement layer may be disposed under the second surface of the first electrode, the first electrode being between the organic layer and the luminescent efficiency improvement layer.

The first electrode and the second electrode may be transmission electrodes, a first luminescent efficiency improvement layer may be disposed over the second surface of the second electrode, the second electrode being between the organic layer and the first luminescent efficiency improvement layer, and a second luminescent efficiency improvement layer may be disposed under the second surface of the first electrode, the first electrode being between the organic layer and the second luminescent efficiency improvement layer.

The organic layer may include R, G, and B pixels, and the luminescent efficiency improvement layer may be a common layer with respect to the R, G, and B pixels.

The organic layer may include R, G and B pixels, and the luminescent efficiency improvement layer may include at least one of a luminescent efficiency improvement layer-R in a region corresponding to the R pixel, a luminescent efficiency improvement layer-G in a region corresponding to the G pixel, and a luminescent efficiency improvement layer-B in a region corresponding to the B pixel.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
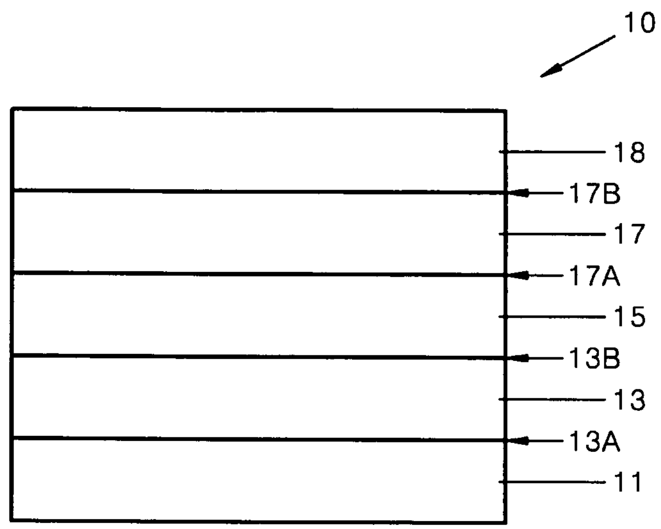
FIG. 1 illustrates a schematic sectional view of an organic light emitting device (OLED) according to an embodiment.

Korean Patent Application No. 10-2010-0029994, filed on Apr. 1, 2010, in the Korean Intellectual Property Office, and entitled: "Organic Light-Emitting Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a schematic sectional view of an organic light-emitting device 10 according to an embodiment.

Referring to FIG. 1, the OLED 10 according to the present embodiment may include a substrate 11, a first electrode 13, an organic layer 15, a second electrode 17, and a luminescent efficiency improvement layer 18, sequentially stacked in this order. The first electrode 13 may have a first surface 13B adjacent to the organic layer 15 and a second surface 13A opposite to the first surface 13B. The second electrode 17 may have a first surface 17A adjacent to the organic layer 15 and a second surface 17B opposite to the first surface 17A. The second electrode 17 may be a transmission electrode, such that light generated in the organic layer 15 may pass through the second electrode 17 and the luminescent efficiency improvement layer 18 and may be extracted or transmitted out of the OLED 10. The first electrode 13 may be a reflective electrode.

The substrate 11, which may be any suitable substrate that is used in organic light-emitting devices, may be, e.g., a glass substrate or a transparent plastic substrate with excellent mechanical strength, thermal stability, transparency, surface smoothness, ease of handling, and water resistance. The first electrode 13 may be formed by, e.g., depositing or sputtering a material that is used to form the first electrode 13 on the substrate 11. When the first electrode 13 constitutes an anode, the material used to form the first electrode 13 may be, e.g., a high work-function material so as to facilitate hole injection. The first electrode 13 may be a reflective electrode or a transmission electrode. Materials having excellent conductivity, e.g., ITO, IZO, $SnO_2$, and/or ZnO, may be used to form the first electrode 13. Other examples of the material for the first electrode 13 may include magnesium (Mg), aluminum (Al), aluminum-lithium (Al—Li), calcium (Ca), magnesium-indium (Mg—In), magnesium-silver (Mg—Ag), and the like. The first electrode 13 may have various structures, e.g., a single-layered structure or a multi-layered structure including different material layers. For example, the first electrode 13 may have a multi-layered structure of ITO/Ag/ITO.

The organic layer 15 may be disposed on the first electrode 13. The term "organic layer" used herein indicates any layer interposed between the first electrode 13 and the second electrode 17. The organic layer 15 may not be formed of pure organic materials, and may also include, e.g., a metal complex.

The organic layer 15 may include at least one of a hole injection layer (HIL), a hole transport layer (HTL), an emission layer (EML), a hole blocking layer (HBL), an electron transport layer (ETL), and an electron injection layer (EIL).

The HIL may be formed on the first electrode 13 by, e.g., vacuum deposition, spin coating, casting, Langmuir-Blodgett (LB) deposition, or the like.

When the HIL is formed using vacuum deposition, vacuum deposition conditions may vary according to the compound that is used to form the HIL, and the desired structure and thermal properties of the HIL to be formed. For example, the vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL, and the structure and thermal properties of the HIL to be formed. For example, the coating rate may be about 2000 to about 5000 rpm, and a temperature at which heat treatment is performed to remove a solvent after coating may be about 80 to about 200° C. However, the coating conditions are not limited thereto.

The HIL 130 may be formed of any suitable material that is used to form a HIL. Examples of the material that may be used to form the HIL include, but are not limited to, N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4"-tris(3-methylphenylphenylamino) triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline)/poly(4-styrenesulfonate (PANI/PSS).

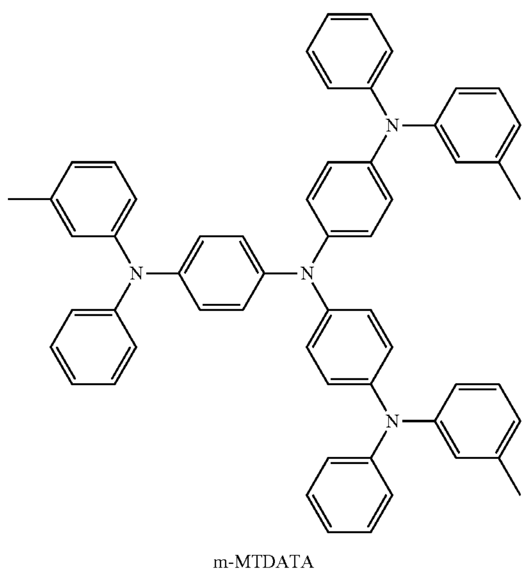

m-MTDATA

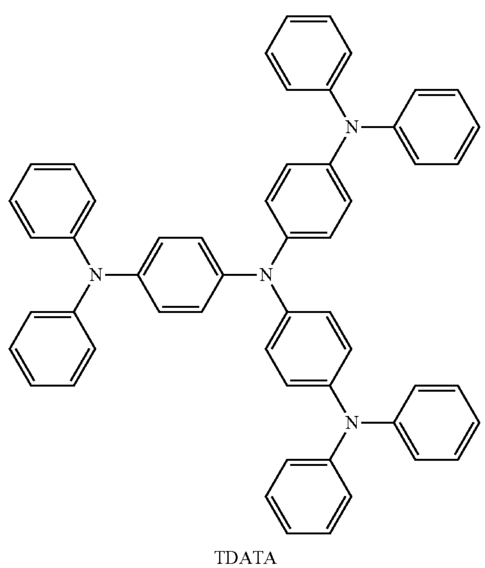

TDATA

-continued

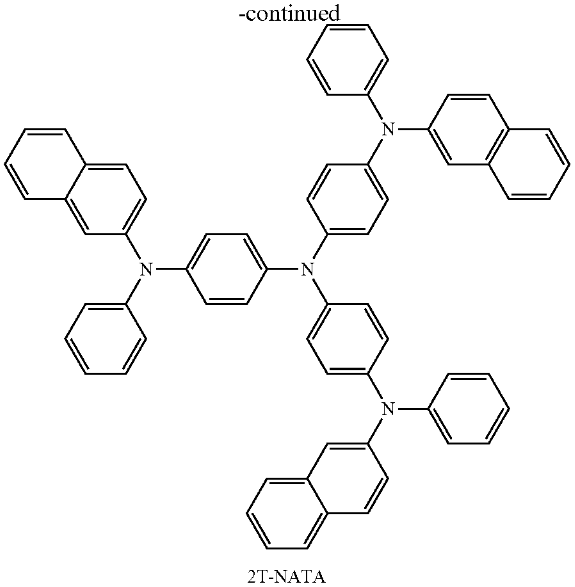

2T-NATA

A thickness of the HIL may be about 100 Å to about 10000 Å. Maintaining the thickness of the HIL at about 100 Å to about 10000 Å may help ensure that the HIL has excellent hole injecting ability without a substantial increase in driving voltage. In an implementation, the thickness of the HIL may be about 100 Å to about 1000 Å.

Then, a HTL may be formed on the HIL by using, e.g., vacuum deposition, spin coating, casting, Langmuir-Blodgett (LB) deposition, or the like. When the HTL is formed using vacuum deposition or spin coating, the conditions for deposition and coating may be similar to those for the formation of the HIL, though the conditions for the deposition and coating may vary according to the material that is used to form the HTL.

The HTL may be formed of any suitable material that is used to form a HTL without limitations. Examples of the material that can be used to form the HTL may include a carbazole derivative such as N-phenylcarbazole and polyvinylcarbazole; an amine derivative having an aromatic condensation ring such as N,N'-bis(3-methylphenyl)-N,N'-diphenyl-[1,1-biphenyl]-4,4'-diamine (TPD), and α-NPD; and a triphenylamine-based material such as 4,4',4"-tris(N-carbazolyl)triphenylamine (TCTA). Among these materials, TCTA may not only transport holes but may also inhibit excitons from being diffused from the EML.

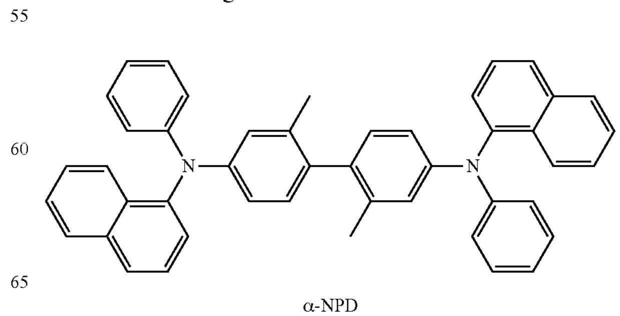

α-NPD

-continued

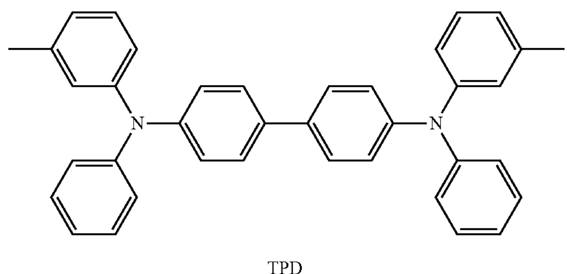

TPD

The thickness of the HTL may be about 50 Å to about 1000 Å. Maintaining the thickness of the HTL at about 50 Å to about 1000 Å may help ensure that the HTL has excellent hole transporting ability without a substantial increase in driving voltage. In an implementation, the thickness of the HTL may be about 100 Å to about 800 Å.

Then, the EML may be formed on the HTL by using, e.g., vacuum deposition, spin coating, casting, LB deposition, or the like. When the EML is formed using vacuum deposition or spin coating, the deposition and coating conditions may be similar to those for the formation of the HIL, though the conditions for deposition and coating may vary according to the material that is used to form the EML.

The EML may be formed of suitable light-emitting materials, including hosts and dopants. Examples of the host may include $Alq_3$, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracene (TBADN), E3, and distyrylarylene (DSA), but are not limited thereto.

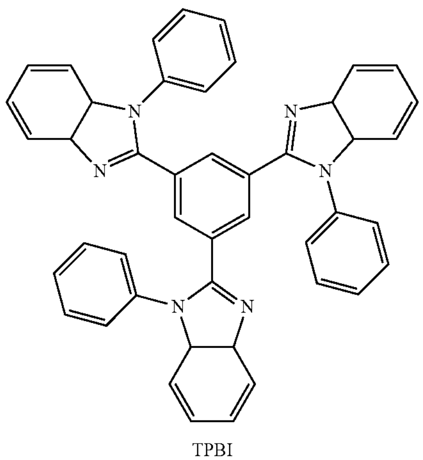

TPBI

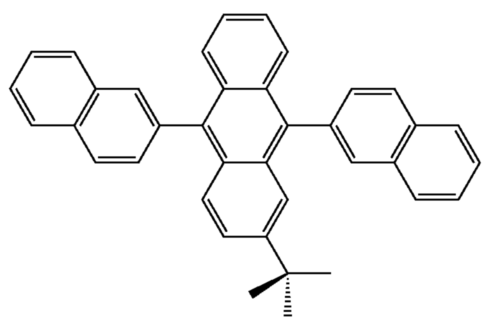

TBADN

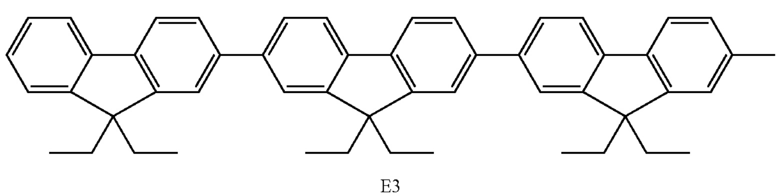

E3

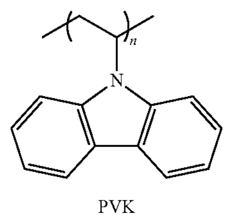

PVK

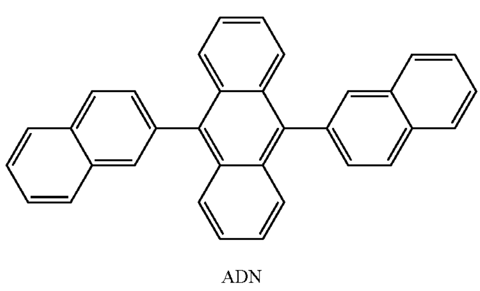

ADN

Examples of suitable red dopants may include, but are not limited to, PtOEP, $Ir(piq)_3$, and $Btp_2Ir(acac)$.

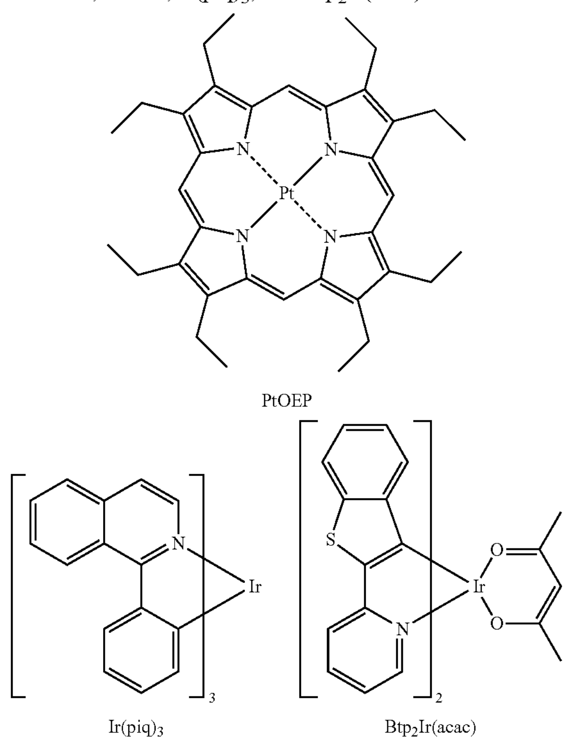

Examples of suitable green dopants may include $Ir(ppy)_3$ (ppy=phenylpyridine), $Ir(ppy)_2(acac)$, and $Ir(mpyp)_3$, but are not limited thereto.

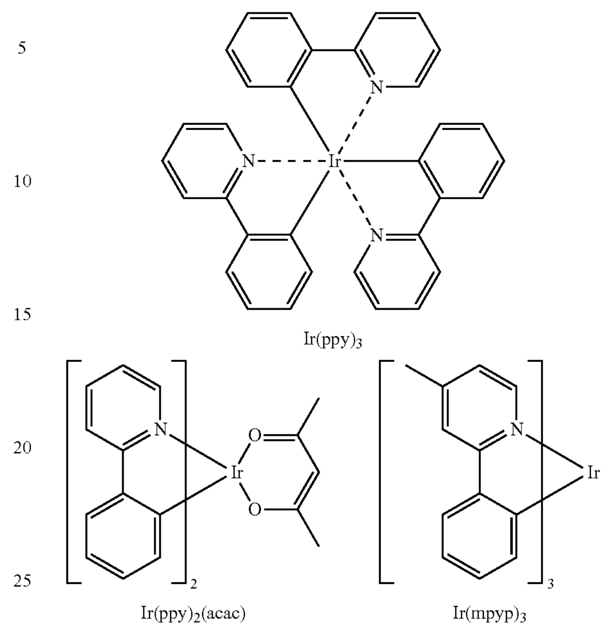

Examples of suitable blue dopants may include $F_2Irpic$, $(F_2ppy)_2Ir(tmd)$, $Ir(dfppz)_3$, ter-fluorene, 4,4'-bis(4-diphenylaminostyryl)biphenyl (DPAVBi), and 2,5,8,11-tetra-t-butyl pherylene (TBPe), but are not limited thereto.

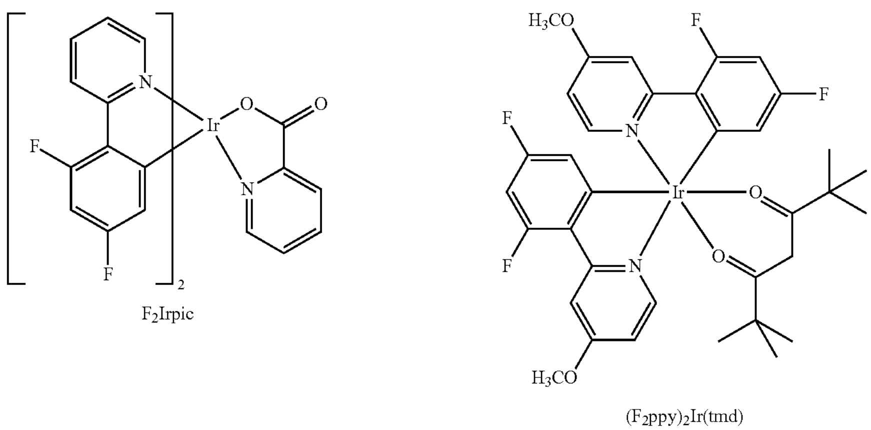

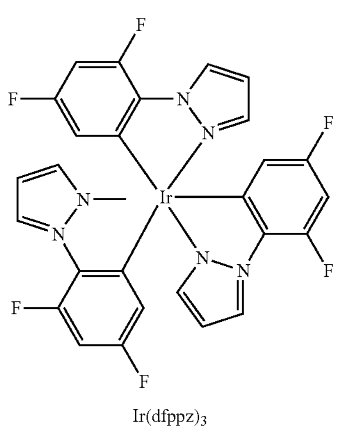

-continued

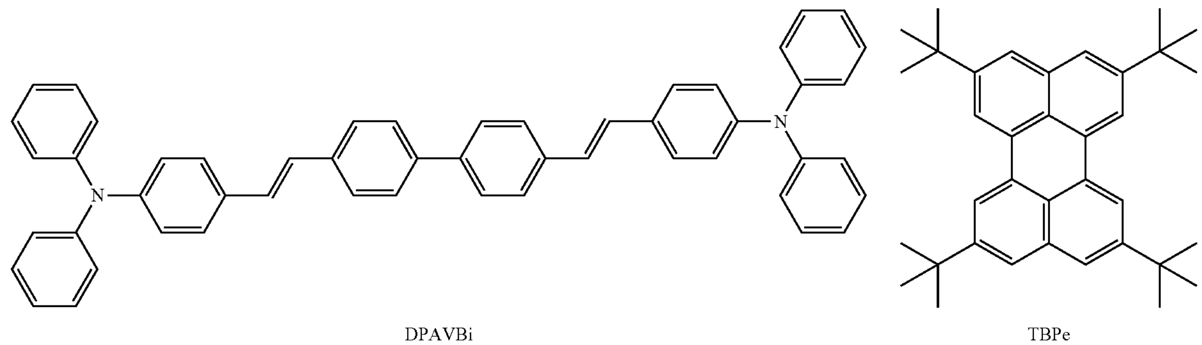

DPAVBi

TBPe

When the EML includes a host and a dopant, the amount of the dopant may be about 0.01 to about 15 parts by weight, based on 100 parts by weight of the host, but is not limited thereto.

The thickness of the EML may be about 100 Å to about 1000 Å. In an implementation, the thickness of the EML may be about 100 Å to about 600 Å. Maintaining the thickness of the EML at about 100 Å to about 1000 Å may help ensure that the EML has excellent light emitting ability without a substantial increase in driving voltage.

When a phosphorescent dopant is also used to form the EML, a HBL may be formed between the HTL and the EML by using, e.g., vacuum deposition, spin coating, casting, Langmuir-Blodgett (LB) deposition, or the like, in order to prevent diffusion of triplet excitons or holes into an ETL. When the HBL is formed using vacuum deposition or spin coating, the conditions for deposition and coating may be similar to those for the formation of the HIL, although the conditions for deposition and coating may vary according to the material that is used to form the HBL. Any suitable material that is used to form a HBL may be used. Examples of materials for forming the HBL may include an oxadiazole derivative, a triazole derivative, and a phenanthroline derivative, but are not limited thereto.

The thickness of the HBL may be about 50 Å to about 1000 Å. Maintaining the thickness of the HBL at about 50 Å to about 1000 Å may help ensure that the HBL has an excellent hole blocking ability without a substantial increase in driving voltage. In an implementation, the thickness of the HBL may be about 100 Å to about 300 Å.

Then, an ETL may be formed on the HBL or EML by, e.g., vacuum deposition, spin coating, casting, or the like. When the ETL is formed using vacuum deposition or spin coating, the deposition and coating conditions may be similar to those for the formation of the HIL, though the deposition and coating conditions may vary according to the material that is used to form the ETL. A material for forming the ETL may be any suitable material that can stably transport electrons injected from an electron injecting electrode (cathode). Examples of materials for forming the ETL may include a quinoline derivative, such as tris(8-quinolinorate)aluminum ($Alq_3$), TAZ, Balq, and beryllium bis(benzoquinolin-10-olate) ($Bebq_2$), but are not limited thereto.

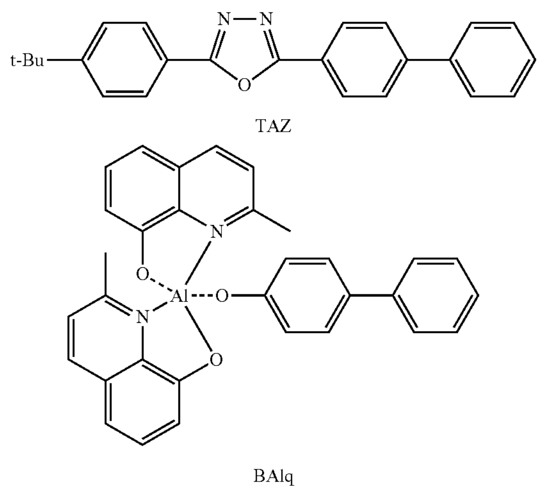

TAZ

BAlq

The thickness of the ETL may be about 100 Å to about 1,000 Å. Maintaining the thickness of the ETL at about 100 Å to about 1,000 Å may help ensure that the ETL has satisfactory electron transporting ability without a substantial increase in driving voltage. In an implementation, the thickness of the ETL may be about 150 Å to about 500 Å.

Then, an EIL may be formed on the ETL. The EIL may be formed of any suitable material facilitating injection of electrons from the cathode.

Examples of materials for forming the EIL may include LiF, NaCl, CsF, $Li_2O$, and BaO. The deposition and coating conditions for the EIL may be similar to those for the formation of the HIL, though the deposition and coating conditions may vary according to the material that is used to form the EIL.

The thickness of the EIL may be about 1 Å to about 100 Å. Maintaining the thickness of the EIL at about 1 Å to about 100 Å may help ensure that the EIL has satisfactory electron injection ability without a substantial increase in driving voltage. In an implementation, the thickness of the EIL may be about 3 Å to about 90 Å.

Finally, the second electrode 17, which may be a transmission electrode, may be disposed on the organic layer 15. The second electrode 17 may be a cathode that is an electron injection electrode. A material for forming the second electrode 17 may include, e.g., a metal, an alloy, an electroconductive compound, materials that have a low work function, or mixtures thereof. Examples of a material for the second electrode 17 may include, but are not limited to, lithium (Li), magnesium (Mg), aluminum (Al), aluminum (Al)-lithium (Li), calcium (Ca), magnesium (Mg)-indium (In), and magnesium (Mg)-silver (Ag).

The term "transmission electrode" used herein denotes an electrode capable of transmitting about 50% or more of light in a visible light wavelength range (e.g., about 380 nm to about 780 nm), for example, 70% or more, more specifically, 90% or more, and this will be easily understood by one of ordinary skill in the art.

The luminescent efficiency improvement layer 18 may be formed on the second surface 17B of the second electrode 17, i.e., the transmission electrode, which is opposite to the first surface 17A adjacent to the organic layer 15.

The luminescent efficiency improvement layer 18 may include a condensed-cyclic compound represented by Formula 1 below:

Formula 1

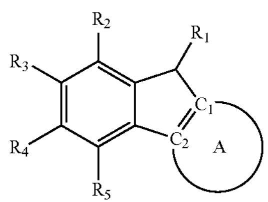

In Formula 1 above, ring A may be represented by Formula 2 or 3 below:

Formula 2

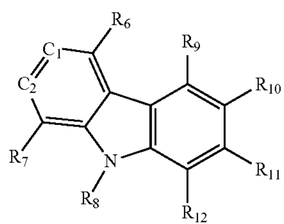

Formula 3

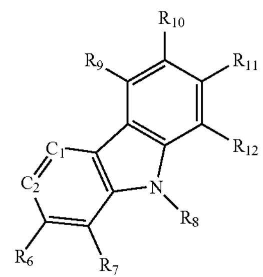

In Formula 1, $C_1$ is the same carbon as $C_1$ in Formula 2 and $C_1$ in Formula 3. In addition, in Formula 1, $C_2$ is the same carbon as $C_2$ in Formula 2 and $C_2$ in Formula 3. In Formulae 1, 2, and 3, $R_1$ through $R_{12}$ may each independently be a hydrogen atom, a heavy hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a first substituent represented by —$(Ar_1)_a$—$Ar_{11}$, a second substituent represented by —N[—$(Ar_2)_b$—$Ar_{12}$][—$(Ar_3)_c$—$Ar_{13}$], or a third substituent represented by —$(Ar_4)_d$—N[$Ar_5)_e$—$Ar_{15}$][—$(Ar_6)_f$—$Ar_{16}$].

$Ar_1$ through $Ar_6$, among the first to third substituents, may each independently be a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, or a substituted or unsubstituted $C_3$-$C_{30}$ heteroarylene group. In this regard, $Ar_1$ to $Ar_6$ may each independently be a substituted or unsubstituted $C_5$-$C_{14}$ arylene group or a substituted or unsubstituted $C_3$-$C_{14}$ heteroarylene group, but are not limited thereto. In an implementation, $Ar_1$ through $Ar_6$, among the first to third substituents, may each independently be a substituted or unsubstituted $C_6$-$C_{30}$ arylene group.

For example, $Ar_1$ through $Ar_3$ may each independently be a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, or a substituted or unsubstituted isoxazolylene group.

For example, $Ar_1$ through $Ar_6$ may each independently be a phenylene group, a $C_1$-$C_{10}$ alkylphenylene group, a di($C_1$-$C_{10}$ alkyl)phenylene group, a ($C_6$-$C_{14}$ aryl)phenylene group, a di($C_6$-$C_{14}$ aryl)phenylene group, a carbazolylene group, a $C_1$-$C_{10}$ alkylcarbazolylene group, a di($C_1$-$C_{10}$ alkyl)carbazolylene group, a $C_6$-$C_{14}$ arylcarbazolylene group, a di($C_6$-$C_{14}$ aryl)carbazolylene group, a fluorenylene group, a $C_1$-$C_{10}$ alkylfluorenylene group, a di($C_1$-$C_{10}$ alkyl)fluorenylene group, a ($C_6$-$C_{14}$ aryl)fluorenylene group, a di($C_6$-$C_{14}$ aryl) fluorenylene group, a naphthylene group, a $C_1$-$C_{10}$ alkylnaphthylene group, a di($C_1$-$C_{10}$ alkyl)naphthylene group, a ($C_6$-$C_{14}$ aryl)naphthylene group, a di($C_6$-$C_{14}$ aryl)naphthylene group, an anthrylene group, a $C_1$-$C_{10}$ alkylanthrylene group, a di($C_1$-$C_{10}$ alkyl)anthrylene group, a ($C_6$-$C_{14}$ aryl) anthrylene group, a di($C_6$-$C_{14}$ aryl)anthrylene group, a pyridinylene group, a $C_1$-$C_{10}$ alkylpyridinylene group, a di($C_1$-$C_{10}$ alkyl)pyridinylene group, a ($C_6$-$C_{14}$ aryl)pyridinylene group, a di($C_6$-$C_{14}$ aryl)pyridinylene group, a quinolinylene group, a $C_1$-$C_{10}$ alkylquinolinylene group, a di($C_1$-$C_{10}$ alkyl)quinolinylene group, a ($C_6$-$C_{14}$ aryl)quinolinylene group, a di($C_6$-$C_{14}$ aryl)quinolinylene group, a benzoimidazolylene group, a $C_1$-$C_{10}$ alkylbenzoimidazolylene group, a di($C_1$-$C_{10}$ alkyl)benzoimidazolylene group, a ($C_6$-$C_{14}$ aryl) benzoimidazolylene group, a di($C_6$-$C_{14}$ aryl)benzoimidazolylene group, an imidazopyridinylene group, a $C_1$-$C_{10}$ alkylimidazopyridinylene group, a di($C_1$-$C_{10}$ alkyl)imidazopyridinylene group, a ($C_6$-$C_{14}$ aryl)imidazopyridinylene group, a di($C_6$-$C_{14}$aryl)imidazopyridinylene group, an imidazopyrimidinylene group, a $C_1$-$C_{10}$ alkylimidazopyrimidinylene group, a di($C_1$-$C_{10}$ alkyl) imidazopyrimidinylene group, a ($C_6$-$C_{14}$ aryl)imidazopyrimidinylene group, or a di ($C_6$-$C_{14}$ aryl)imidazopyrimidinylene group, but are not limited thereto. Examples of the $C_1$-$C_{10}$ alkyl group may include a methyl group, an ethyl group, a propyl group, a butyl group, a pentyl group, and the like, and examples of the $C_5$-$C_{14}$aryl group may include a phenyl group, a naphthyl group, an anthryl group, and the like.

$Ar_{11}$, $Ar_{12}$, $Ar_{13}$, $Ar_{15}$, and $Ar_{16}$ may each independently be a hydrogen atom, a heavy hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_5$-$C_{30}$ aryl group, or a substituted or unsubstituted $C_3$-$C_{30}$ heteroaryl group. In this regard, $Ar_{11}$, $Ar_{12}$, $Ar_{13}$, $Ar_{15}$, and $Ar_{16}$ may each independently be a hydrogen atom, a heavy hydrogen, a halogen atom, a hydroxyl group, a cyano group, a substituted or unsubstituted $C_1$-$C_{10}$ alkyl group, a substituted or unsubstituted $C_2$-$C_{10}$ alkenyl group, a substituted or unsubstituted alkynyl group, a substituted or unsubstituted $C_1$-$C_{10}$ alkoxy group, a substituted or unsubstituted $C_5$-$C_{14}$ aryl group, or a substituted or unsubstituted $C_3$-$C_{14}$ heteroaryl group, but is not limited thereto. In an implementation, $Ar_{11}$, $Ar_{12}$, $Ar_{13}$, $Ar_{15}$, and $Ar_{16}$ may each independently be a substituted or unsubstituted $C_6$-$C_{30}$ aryl group.

In detail, $Ar_{11}$, $Ar_{12}$, $Ar_{13}$, $Ar_{15}$, and $Ar_{16}$ may each independently be a hydrogen atom, a heavy hydrogen, a halogen atom, hydroxyl group, a cyano group, a methyl group, a ethyl group, a propyl group, a butyl group, a pentyl group, an ethenyl group, a propenyl group, a butenyl group, a pentenyl group, an acetyl group, a methoxy group, an ethoxy group, a propoxy group, a butoxy group, a pentoxy group, a substituted or unsubstituted phenyl group, a substituted or unsubstituted pentalenyl group, substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted phenalenyl group, a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenylenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted pyrazolyl group, a substituted or unsubstituted imidazolyl group, a substituted or unsubstituted imidazolinyl group, a substituted or unsubstituted imidazopyridinyl group, a substituted or unsubstituted imidazopyrimidinyl group, a substituted or unsubstituted pyridinyl group, a substituted or unsubstituted pyrazinyl group, a substituted or unsubstituted pyrimidinyl group, a substituted or unsubstituted indolyl group, a substituted or unsubstituted purinyl group, a substituted or unsubstituted quinolinyl group, a substituted or unsubstituted phthalazinyl group, a substituted or unsubstituted indolizinyl group, a substituted or unsubstituted naphthyridinyl group, a substituted or unsubstituted quinazolinyl group, a substituted or unsubstituted cinnolinyl group, a substituted or unsubstituted indazolyl group, a substituted or unsubstituted carbazolyl group, a substituted or unsubstituted phenazinyl group, a substituted or unsubstituted phenanthridinyl group, a substituted or unsubstituted pyranyl group, a substituted or unsubstituted chromenyl group, a substituted or unsubstituted benzofuranyl group, a substituted or unsubstituted thiophenyl group, a substituted or unsubstituted benzothiophenyl group, a substituted or unsubstituted isothiazolyl group, a substituted or unsubstituted benzoimidazolyl group, or a substituted or unsubstituted isoxazolyl group, but is not limited thereto.

In detail, $Ar_{11}$, $Ar_{12}$, $Ar_{13}$, $Ar_{15}$, and $Ar_{16}$ may each independently be a hydrogen atom, a heavy hydrogen, a halogen atom, hydroxyl group, a cyano group, a methyl group, a ethyl group, a propyl group, a butyl group, a pentyl group, an ethenyl group, a propenyl group, a butenyl group, a pentenyl group, an acetyl group, a methoxy group, an ethoxy group, a propoxy group, a butoxy group, a pentoxy group, a phenyl group, a $C_1$-$C_{10}$alkyl phenyl group, a di($C_1$-$C_{10}$alkyl)phenyl group, a ($C_6$-$C_{14}$aryl)phenyl group, a di($C_6$-$C_{14}$aryl)phenyl group, a carbazolyl group, a $C_1$-$C_{10}$alkylcarbazolyl group, a di($C_1$-$C_{10}$alkyl)carbazolyl group, a $C_6$-$C_{14}$arylcarbazolyl group, a di($C_6$-$C_{14}$aryl)carbazolyl group, a fluorenyl group, a $C_1$-$C_{10}$alkylfluorenyl group, a di($C_1$-$C_{10}$alkyl)fluorenyl group, a ($C_6$-$C_{14}$aryl)fluorenyl group, a di($C_6$-$C_{14}$aryl)fluorenyl group, a naphthyl group, a $C_1$-$C_{10}$alkylnaphthyl group, a di($C_1$-$C_{10}$alkyl)naphthyl group, a ($C_6$-$C_{14}$aryl)naphthyl group, a di($C_6$-$C_{14}$aryl)naphthyl group, an anthryl group, a $C_1$-$C_{10}$alkylanthryl group, a di($C_1$-$C_{10}$alkyl)anthryl group, a ($C_6$-$C_{14}$aryl)anthryl group, a di($C_6$-$C_{14}$aryl)anthryl group, a pyridinyl group, a $C_1$-$C_{10}$alkylpyridinyl group, a di($C_1$-$C_{10}$alkyl)pyridinyl group, a ($C_6$-$C_{14}$aryl)pyridinyl group, a di($C_6$-$C_{14}$aryl)pyridinyl group, a quinolinyl group, a $C_1$-$C_{10}$alkylquinolinyl group, a di($C_1$-$C_{10}$alkyl)quinolinyl group, a ($C_6$-$C_{14}$aryl)quinolinyl group, a di($C_6$-$C_{14}$aryl) quinolinyl group, a benzoimidazolyl group, a $C_1$-$C_{10}$alkylbenzoimidazolyl group, a di($C_1$-$C_{10}$alkyl)benzoimidazolyl group, a ($C_6$-$C_{14}$aryl)benzoimidazolyl group, a di($C_6$-$C_{14}$aryl)benzoimidazolyl group, an imidazopyridinyl group, a $C_r$ $C_{10}$alkylimidazopyridinyl group, a di($C_1$-$C_{10}$alkyl) imidazopyridinyl group, a ($C_6$-$C_{14}$aryl) imidazopyridinyl group, a di($C_6$-$C_{14}$aryl) imidazopyridinyl group, an imidazopyrimidinyl group, a $C_1$-$C_{10}$alkylimidazopyrimidinyl group, a di($C_1$-$C_{10}$alkyl) imidazopyrimidinyl group, a ($C_6$-$C_{14}$aryl) imidazopyrimidinyl group, or a di($C_6$-$C_{14}$aryl) imidazopyrimidinyl group, but is not limited thereto. Examples of the $C_1$-$C_{10}$alkyl group may include a methyl group, an ethyl group, a propyl group, a butyl group, a pentyl group, and the like, and examples of the $C_5$-$C_{14}$ aryl group may include a phenyl group, a naphthyl group, an anthryl group, and the like.

$Ar_{11}$, $Ar_{12}$, $Ar_{13}$, $Ar_{15}$, and $Ar_{16}$ may each independently be represented by any one of Formulae 4A through 4G below, but are not limited thereto:

Formula 4A

Formula 4B

Formula 4C

Formula 4D

Formula 4E

Formula 4F

Formula 4G

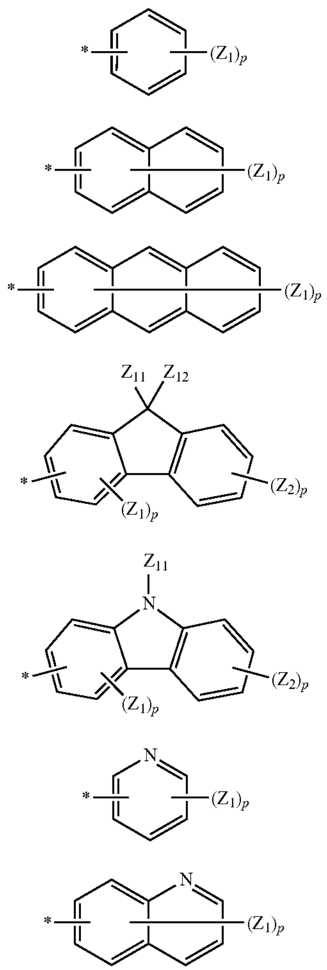

In Formulae 4A to 4G, $Z_1$, $Z_2$, $Z_{11}$ and $Z_{12}$ may each independently be a hydrogen atom, a heavy hydrogen, a $C_1$-$C_{10}$ alkyl group, a $C_1$-$C_{10}$ alkoxy group, or a $C_6$-$C_{14}$ aryl group; p and q may each independently be an integer from 1 to 8; and * denotes a binding site with $Ar_1$, $Ar_2$, $Ar_3$, $Ar_5$ or $Ar_6$. For example, when a in the first substituent is 0, and $Ar_{11}$ is represented by one of Formulae 4A through 4G, * in Formulae 4A through 4G may be a binding site with one of the ring atoms constituting the backbone of Formula 1, and this will be easily understood by one of ordinary skill in the art. In an implementation, q may be an integer of 1 to 4.

For example, $Z_1$, $Z_2$, $Z_{11}$ and $Z_{12}$ may each independently be a hydrogen atom, a heavy hydrogen, a methyl group, an ethyl group, a propyl group, a butyl group, a methoxy group, an ethoxy group, a propoxy group, a phenyl group, a naphthyl group, or an anthryl group.

$Ar_{11}$, $Ar_{12}$, $Ar_{13}$, $Ar_{15}$, and $Ar_{16}$ may each independently be represented by any one of Formulae 5A through 5E below, but are not limited thereto:

Formula 5A

Formula 5B

Formula 5C

Formula 5D

Formula 5E

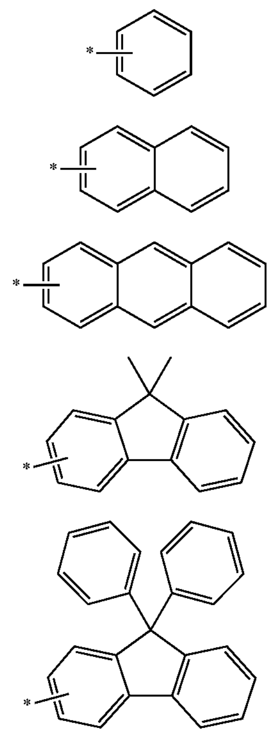

In Formulae 5A to 5D, * may be a binding site with $Ar_1$, $Ar_2$, $Ar_3$, $Ar_5$ or $Ar_6$.

For example, when a in the first substituent is 0, and $Ar_{11}$ is represented by one of Formulae 5A through 5E, * in Formulae 5A through 5E may be a binding site with one of the ring atoms constituting the backbone of Formula 1, and this will be easily understood by one of ordinary skill in the art.

a, b, c, e, and f may each independently be an integer from 0 to 10. For example, a, b, c, e, and f may each independently be 0, 1, 2 or 3, but are not limited thereto.

For example, when a=0, the first substituent may be $Ar_{11}$. $Ar_{11}$ may be directly connected to a ring atom of the backbone of Formula 1. When a=0, the first substituent may be, e.g., a substituted or unsubstituted $C_5$-$C_{30}$ aryl group or a substituted or unsubstituted $C_3$-$C_{30}$ hetero aryl group.

For example, when b=0, $Ar_{12}$ in the second substituent may be directly connected to N. Even when c, e, and f are each 0, the same rule may be applied.

d may be an integer from 1 to 10. For example, d may be 1, 2 or 3, but is not limited thereto.

The second substituent and —N[—$(Ar_5)_e$—$Ar_{15}$][—$(Ar_6)_f$—$Ar_{16}$] of the third substituent may each independently be represented by one of Formulae 6A through 6K:

Formula 6A

*—N $(Z_1)_p$ $(Z_2)_q$

-continued
Formula 6B
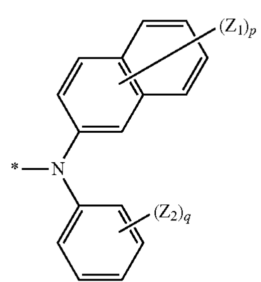
Formula 6C
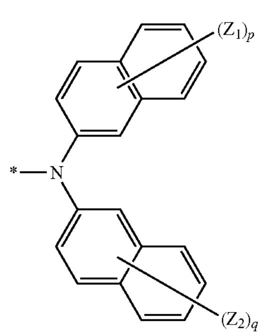
Formula 6D
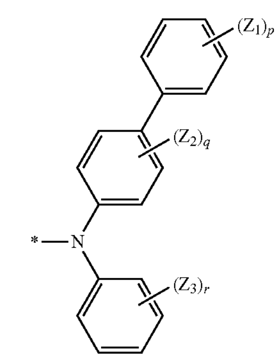
Formula 6E
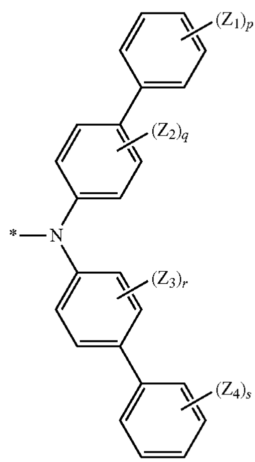
-continued
Formula 6F
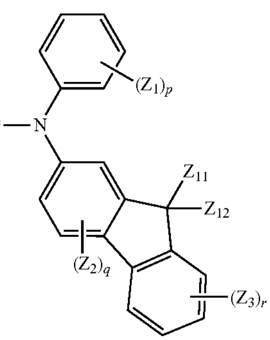
Formula 6G
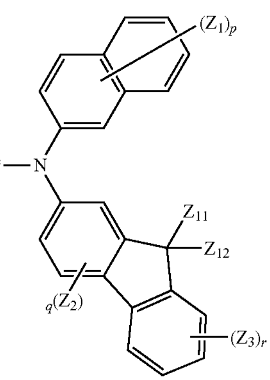
Formula 6H
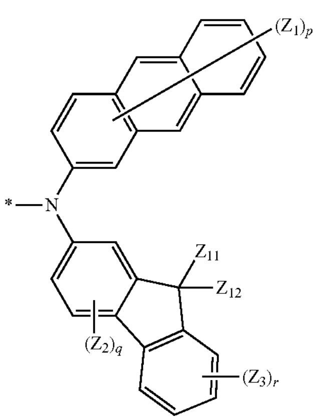
Formula 6I -continued Formula 6J Formula 6K

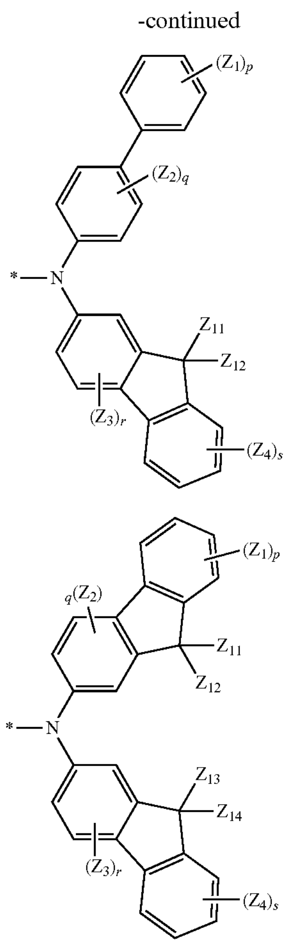

In Formulae 6A to 6K, $Z_1$ through $Z_4$, and $Z_{11}$ through $Z_{14}$ may each independently be a hydrogen atom, a heavy hydrogen, a $C_1$-$C_{10}$ alkyl group (for example, a methyl group, an ethyl group, a propyl group, a butyl group, a pentyl group, and the like), a $C_1$-$C_{10}$ alkoxy group (for example, a methoxy group, an ethoxy group, a propoxy group, a butoxy group, a pentoxy group, and the like), or a $C_6$-$C_{14}$ aryl group (for example, a phenyl group, a naphthyl group, an anthryl group, and the like); p, q, r, and s may each independently be an integer from 1 to 8; and * denotes a binding site with $Ar_4$ or with a ring atom of the backbone of Formula 1. In an implementation, q may be an integer from 1 to 7, and r and s may be an integer from 1 to 4.

In Formula 1, a groups of $Ar_1$ in the group of $—(Ar_1)_a—Ar_{11}$ of the first substituent may be identical to or different from each other; b groups of $Ar_2$ in the group of $—(Ar_2)_b—Ar_{12}$ of the second substituent may be identical to or different from each other; c groups of $Ar_a$ in the group of $—(Ar_3)_c—Ar_{13}$ of the second substituent may be identical to or different from each other; e groups of $Ar_5$ in the group of $—(Ar_5)_e—Ar_{15}$ of the third substituent may be identical to or different from each other; and f groups of $Ar_6$ in the group of $—(Ar_6)_f—Ar_{16}$ of the third substituent may be identical to or different from each other.

In Formula 1, $R_1$ through $R_{12}$ may each independently be a hydrogen atom, a heavy hydrogen, a halogen atom, a hydroxyl group, a cyano group, the first substituent, the second substituent, or the third substituent; a in the first substituent may be 0 (that is, when one of $R_1$ through $R_{12}$ is the first substituent, $Ar_{11}$ is directly connected to a ring atom of the backbone of Formula 1); b and c in the second substituent may each independently be 0 or 1; d in the third substituent may be 1 or 2, and e and f therein may each independently be 0 or 1; $Ar_2$ through $Ar_6$ in the first through third substituents may each independently be a substituted or unsubstituted $C_5$-$C_{14}$arylene group, or a substituted or unsubstituted $C_3$-$C_{14}$heteroarylene group; and $Ar_{11}$, $Ar_{12}$, $Ar_{13}$, $Ar_{15}$, and $Ar_{16}$ in the first through third substituents may each independently be a hydrogen atom, a heavy hydrogen, a halogen atom, a hydroxyl group, a cyano group, a substituted or unsubstituted $C_1$-$C_{10}$alkyl group, a substituted or unsubstituted $C_2$-$C_{10}$alkenyl group, a substituted or unsubstituted $C_2$-$C_{10}$alkynyl group, a substituted or unsubstituted $C_1$-$C_{10}$alkoxy group, a substituted or unsubstituted $C_5$-$C_{14}$aryl group, or a substituted or unsubstituted $C_3$-$C_{14}$heteroaryl group. In an implementation, $Ar_2$ through $Ar_6$, among the first to third substituents, may each independently be a substituted or unsubstituted $C_6$-$C_{14}$ arylene group.

For example, $R_1$ through $R_{12}$ may each independently be a hydrogen atom, a heavy hydrogen, a halogen atom, a hydroxyl group, a cyano group, the first substituent, the second substituent, or the third substituent; a in the first substituent may be 0; b and c in the second substituent may each independently be 0 or 1; d in the third substituent may be 1 or 2 and e and f therein may each independently be 0 or 1; and $Ar_2$ through $Ar_6$ in the first through third substituents may each independently be a phenylene group, a $C_1$-$C_{10}$alkylphenylene group, a di($C_1$-$C_{10}$alkyl)phenylene group, a ($C_6$-$C_{14}$aryl)phenylene group, a di($C_6$-$C_{14}$aryl)phenylene group, a carbazolylene group, a $C_1$-$C_{10}$alkylcarbazolylene group, a di($C_1$-$C_{10}$alkyl)carbazolylene group, a $C_6$-$C_{14}$arylcarbazolylene group, a di($C_6$-$C_{14}$aryl)carbazolylene group, a fluorenylene group, a $C_1$-$C_{10}$alkylfluorenylene group, a di($C_1$-$C_{10}$alkyl)fluorenylene group, a ($C_6$-$C_{14}$aryl)fluorenylene group, a di($C_6$-$C_{14}$aryl)fluorenylene group, a naphthylene group, a $C_1$-$C_{10}$alkylnaphthylene group, a di($C_1$-$C_{10}$alkyl)naphthylene group, a ($C_6$-$C_{14}$aryl)naphthylene group, a di($C_6$-$C_{14}$aryl)naphthylene group, an anthrylene group, a $C_1$-$C_{10}$alkylanthrylene group, a di($C_1$-$C_{10}$alkyl)anthrylene group, a ($C_6$-$C_{14}$aryl)anthrylene group, a di($C_6$-$C_{14}$aryl)anthrylene group, a pyridinylene group, a $C_1$-$C_{10}$alkylpyridinylene group, a di($C_1$-$C_{10}$alkyl)pyridinylene group, a ($C_6$-$C_{14}$aryl)pyridinylene group, a di($C_6$-$C_{14}$aryl)pyridinylene group, a quinolinylene group, a $C_1$-$C_{10}$alkylquinolinylene group, a di($C_1$-$C_{10}$alkyl)quinolinylene group, a ($C_6$-$C_{14}$aryl)quinolinylene group, a di($C_6$-$C_{14}$aryl)quinolinylene group, a benzoimidazolylene group, a $C_1$-$C_{10}$alkylbenzoimidazolylene group, a di($C_1$-$C_{10}$alkyl) benzoimidazolylene group, a ($C_6$-$C_{14}$aryl)benzoimidazolylene group, a di($C_6$-$C_{14}$aryl)benzoimidazolylene group, an imidazopyridinylene group, a $C_1$-$C_{10}$alkylimidazopyridinylene group, a di($C_1$-$C_{10}$alkyl) imidazopyridinylene group, a ($C_6$-$C_{14}$aryl) imidazopyridinylene group, a di($C_6$-$C_{14}$aryl) imidazopyridinylene group, an imidazopyrimidinylene group, a $C_1$-$C_{10}$alkylimidazopyrimidinylene group, a di($C_1$-$C_{10}$alkyl) imidazopyrimidinylene group, a ($C_6$-$C_{14}$aryl) imidazopyrimidinylene group, or a di($C_6$-$C_{14}$aryl) imidazopyrimidinylene group; and $Ar_{11}$, $Ar_{12}$, $Ar_{13}$, $Ar_{15}$, and $Ar_{16}$ in the first through third substituents may each independently be a hydrogen atom, a heavy hydrogen, a halogen atom, a hydroxyl group, a cyano group, a methyl group, a ethyl group, a propyl group, a butyl group, a pentyl group, an ethenyl group, a propenyl group, a butenyl group, a pentenyl group, an acetyl group, a methoxy group, an ethoxy group, a propoxy group, a butoxy group, a pentoxy group, a phenyl group, a $C_1$-$C_{10}$alkyla phenyl group, a di($C_1$-$C_{10}$alkyl)phenyl group, a ($C_6$-$C_{14}$aryl)phenyl group, a di($C_6$-$C_{14}$aryl)phenyl group, a carbazolyl group, a $C_1$-$C_{10}$alkylcarbazolyl group, a di($C_1$-$C_{10}$alkyl)carbazolyl group, a $C_6$-$C_{14}$arylcarbazolyl group, a di($C_6$-$C_{14}$aryl)carbazolyl group, a fluorenyl group, a $C_1$-$C_{10}$alkylfluorenyl group, a di($C_1$-$C_{10}$alkyl)fluorenyl group, a ($C_6$-$C_{14}$aryl)fluorenyl group, a di($C_6$-$C_{14}$aryl)fluorenyl group, a naphthyl group, a $C_1$-$C_{10}$alkylnaphthyl group, a di($C_1$-$C_{10}$alkyl)naphthyl group, a ($C_6$-$C_{14}$aryl)naphthyl group, a di($C_6$-$C_{14}$aryl)naphthyl group, an anthryl group, a $C_1$-$C_{10}$alkylanthryl group, a di($C_1$-$C_{10}$alkyl)anthryl group, a ($C_6$-$C_{14}$aryl)anthryl group, a di($C_6$-$C_{14}$aryl)anthryl group, a pyridinyl group, a $C_1$-$C_{10}$alkylpyridinyl group, a di($C_1$-$C_{10}$alkyl)pyridinyl group, a ($C_6$-$C_{14}$aryl)pyridinyl group, a di($C_6$-$C_{14}$aryl)pyridinyl group, a quinolinyl group, a $C_1$-$C_{10}$alkylquinolinyl group, a di($C_1$-$C_{10}$alkyl)quinolinyl group, a ($C_6$-$C_{14}$aryl)quinolinyl group, a di($C_6$-$C_{14}$aryl) quinolinyl group, a benzoimidazolyl group, a $C_1$-$C_{10}$alkylbenzoimidazolyl group, a di($C_1$-$C_{10}$alkyl)benzoimidazolyl group, a ($C_6$-$C_{14}$aryl)benzoimidazolyl group, a di($C_6$-$C_{14}$aryl)benzoimidazolyl group, an imidazopyridinyl group, a $C_1$-$C_{10}$alkylimidazopyridinyl group, a di($C_1$-$C_{10}$alkyl) imidazopyridinyl group, a ($C_6$-$C_{14}$aryl) imidazopyridinyl group, a di($C_6$-$C_{14}$aryl) imidazopyridinyl group, an imidazopyrimidinyl group, a $C_1$-$C_{10}$ alkylimidazopyrimidinyl group, di($C_1$-$C_{10}$alkyl) imidazopyrimidinyl group, a ($C_6$-$C_{14}$aryl) imidazopyrimidinyl group, or a di($C_6$-$C_{14}$aryl) imidazopyrimidinyl group, but is not limited thereto.

The condensed-cyclic compound of Formula 1 may be represented by one of Formulae 2a through 2d corresponding to examples where ring A of Formula 1 is represented by Formula 2:

Formula 2a

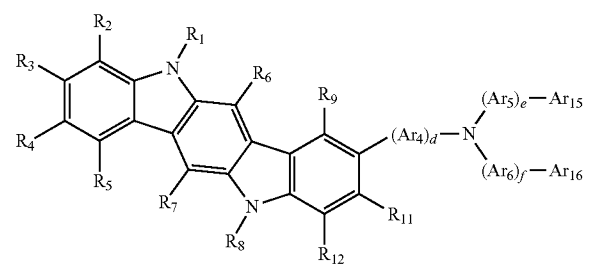

Formula 2b

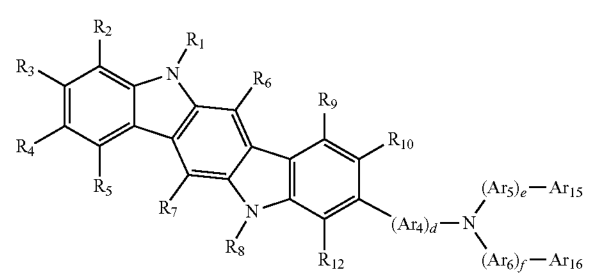

-continued

Formula 2c

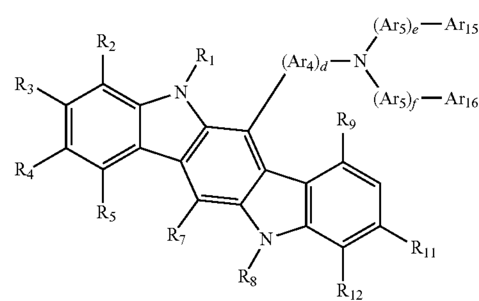

Formula 2d

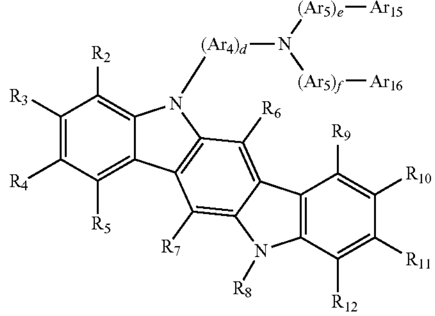

In Formulae 2a through 2d, $R_1$ through $R_{12}$, $Ar_1$ through $Ar_6$, $Ar_{11}$, $Ar_{12}$, $Ar_{13}$, $Ar_{15}$, $Ar_{16}$, a, b, c, d, and f may be defined as described above.

In Formulae 2a through 2d, $Ar_4$ may include at least one of a phenylene group, a $C_1$-$C_{10}$ alkylphenylene group, a di($C_1$-$C_{10}$ alkyl)phenylene group, a ($C_6$-$C_{14}$ aryl)phenylene group, a di($C_6$-$C_{14}$ aryl)phenylene group, a carbazolylene group, a $C_1$-$C_{10}$ alkylcarbazolylene group, a di($C_1$-$C_{10}$ alkyl)carbazolylene group, a $C_6$-$C_{14}$ arylcarbazolylene group, a di($C_6$-$C_{14}$ aryl)carbazolylene group, a fluorenylene group, a $C_1$-$C_{10}$ alkylfluorenylene group, a di($C_1$-$C_{10}$ alkyl)fluorenylene group, a ($C_6$-$C_{14}$ aryl)fluorenylene group, a di($C_6$-$C_{14}$ aryl) fluorenylene group, a naphthylene group, a $C_1$-$C_{10}$ alkylnaphthylene group, a di($C_1$-$C_{10}$ alkyl)naphthylene group, a ($C_6$-$C_{14}$ aryl)naphthylene group, a di($C_6$-$C_{14}$ aryl)naphthylene group, an anthrylene group, a $C_1$-$C_{10}$ alkylanthrylene group, a di($C_1$-$C_{10}$ alkyl)nthrylene group, a ($C_6$-$C_{14}$ aryl) nthrylene group, a di($C_6$-$C_{14}$ aryl)nthrylene group, a pyridinylene group, a $C_1$-$C_{10}$ alkylpyridinylene group, a di($C_1$-$C_{10}$ alkyl)pyridinylene group, a ($C_6$-$C_{14}$ aryl)pyridinylene group, a di($C_6$-$C_{14}$ aryl)pyridinylene group, a quinolinylene group, a $C_1$-$C_{10}$ alkylquinolinylene group, a di($C_1$-$C_{10}$ alkyl)quinolinylene group, a ($C_6$-$C_{14}$ aryl)quinolinylene group, a di($C_6$-$C_{14}$ aryl)quinolinylene group, a benzoimidazolylene group, a $C_1$-$C_{14}$ alkylbenzoimidazolylene group, a di($C_1$-$C_{10}$ alkyl) benzoimidazolylene group, a ($C_6$-$C_{14}$ aryl)benzoimidazolylene group, a di($C_6$-$C_{14}$ aryl)benzoimidazolylene group, an imidazopyridinylene group, a $C_1$-$C_{10}$ alkylimidazopyridinylene group, a di($C_1$-$C_{10}$ alkyl)imidazopyridinylene group, a ($C_6$-$C_{14}$ aryl)imidazopyridinylene group, a di($C_6$-$C_{14}$aryl) imidazopyridinylene group, an imidazopyrimidinylene group, a $C_1$-$C_{10}$ alkylimidazopyrimidinylene group, a di($C_1$-$C_{10}$ alkyl) imidazopyrimidinylene group, a ($C_6$-$C_{14}$ aryl)imidazopyrimidinylene group, and a di($C_6$-$C_{14}$ aryl)imidazopyrimidinylene group, but is not limited thereto. In Formula 2a through 2d, d may be 1, 2 or 3. For example, in the formulae 2a through 2d, $Ar_4$ may be a phenylene group and d may be 1 or 2, but is not limited thereto.

$—N[—(Ar_5)_e—Ar_{15}][—(Ar_6)_f—Ar_{16}]$ of the third substituent represented by $—(Ar_a)_d—N[—(Ar_5)_e—Ar_{15}][—(Ar_6)_f—Ar_{16}]$ in Formulae 2a through 2d may be represented by one of Formulae 6A through 6K.

For example, $R_1$ and $R_8$ in Formulae 2a through 2c may be the first substituent and a in the first substituents may be 0. For example, $R_1$ and $R_8$ in Formulae 2a through 2c may be the first substituent and a in the first substituents may be 0 and $Ar_{11}$ therein may include at least one of a substituted or unsubstituted $C_5$-$C_{14}$aryl group and a substituted or unsubstituted $C_3$-$C_{14}$heteroaryl group. In an implementation, $R_1$ and $R_8$ in Formulae 2a through 2c may be each a phenyl group.

For example, $R_8$ in Formula 2d may be the first substituent and a in the first substituent may be 0. For example, $R_8$ in Formula 2d may be the first substituent a in the first substituent may be 0 and $Ar_{11}$ therein may include at least one of a substituted or unsubstituted $C_5$-$C_{14}$aryl group and a substituted or unsubstituted $C_3$-$C_{14}$heteroaryl group. In an implementation, $R_1$ and $R_8$ in Formula 2d may be each a phenyl group.

In an implementation, the condensed-cyclic compound of Formula 1 may be represented by one of Formulae 3a through 3e corresponding to examples where ring A of Formula 1 is represented by Formula 3:

Formula 3a

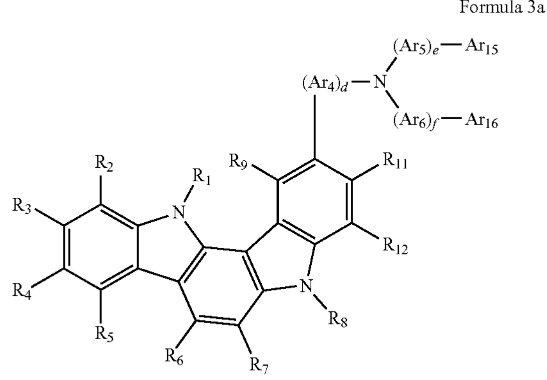

Formula 3b

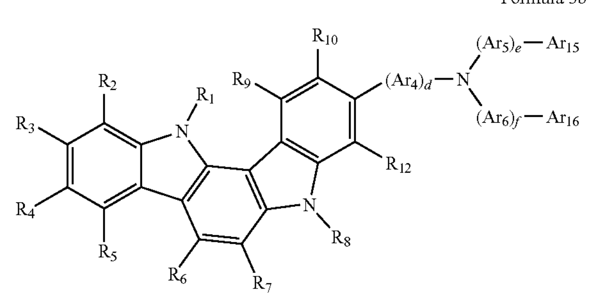

Formula 3c

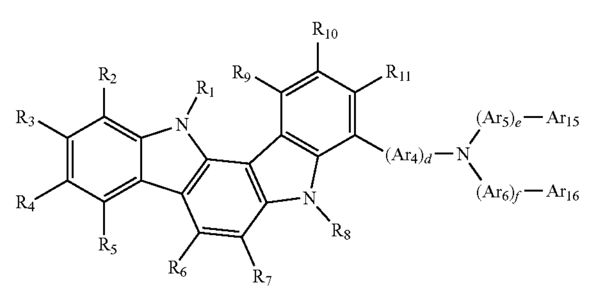

-continued

Formula 3d

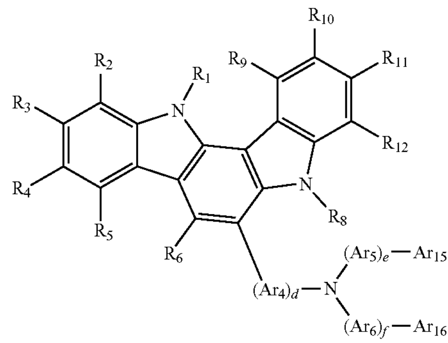

Formula 3e

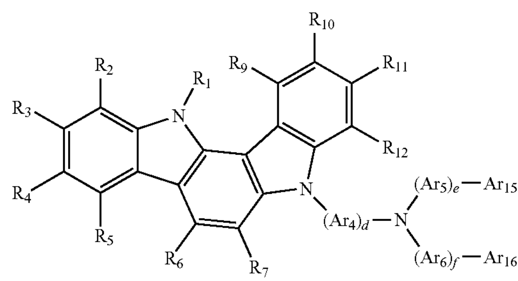

In Formulae 3a through 3e, $R_1$ through $R_{12}$, $Ar_1$ through $Ar_6$, $Ar_{11}$, $Ar_{12}$, $Ar_{13}$, $Ar_{15}$, $Ar_{16}$, a, b, c, d, and f may be defined as described above.

In Formulae 3a through 3e, $Ar_4$ may include at least one of a phenylene group, a $C_1$-$C_{10}$ alkylphenylene group, a di($C_1$-$C_{10}$ alkyl)phenylene group, a ($C_6$-$C_{14}$ aryl)phenylene group, a di($C_6$-$C_{14}$ aryl)phenylene group, a carbazolylene group, a $C_1$-$C_{10}$ alkylcarbazolylene group, a di($C_1$-$C_{10}$ alkyl)carbazolylene group, a $C_6$-$C_{14}$ arylcarbazolylene group, a di($C_6$-$C_{14}$ aryl)carbazolylene group, a fluorenylene group, a $C_1$-$C_{10}$ alkylfluorenylene group, a di($C_1$-$C_{10}$ alkyl)fluorenylene group, a ($C_6$-$C_{14}$ aryl)fluorenylene group, a di($C_6$-$C_{14}$ aryl) fluorenylene group, a naphthylene group, a $C_1$-$C_{10}$ alkylnaphthylene group, a di($C_1$-$C_{10}$ alkyl)naphthylene group, a ($C_6$-$C_{14}$ aryl)naphthylene group, a di($C_6$-$C_{14}$ aryl)naphthylene group, an anthrylene group, a $C_1$-$C_{10}$ alkylanthrylene group, a di($C_1$-$C_{10}$ alkyl)anthrylene group, a ($C_6$-$C_{14}$ aryl) anthrylene group, a di($C_6$-$C_{14}$ aryl)anthrylene group, a pyridinylene group, a $C_1$-$C_{10}$ alkylpyridinylene group, a di($C_1$-$C_{10}$ alkyl)pyridinylene group, a ($C_6$-$C_{14}$ aryl)pyridinylene group, a di($C_6$-$C_{14}$ aryl)pyridinylene group, a quinolinylene group, a $C_1$-$C_{10}$ alkylquinolinylene group, a di($C_1$-$C_{10}$ alkyl)quinolinylene group, a ($C_6$-$C_{14}$ aryl)quinolinylene group, a di($C_6$-$C_{14}$ aryl)quinolinylene group, a benzoimidazolylene group, a $C_1$-$C_{10}$ alkylbenzoimidazolylene group, a di($C_1$-$C_{10}$ alkyl)benzoimidazolylene group, a ($C_6$-$C_{14}$ aryl) benzoimidazolylene group, a di($C_6$-$C_{14}$ aryl)benzoimidazolylene group, an imidazopyridinylene group, a $C_1$-$C_{10}$ alkylimidazopyridinylene group, a di($C_1$-$C_{10}$ alkyl)imidazopyridinylene group, a ($C_6$-$C_{14}$ aryl)imidazopyridinylene group, a di($C_6$-$C_{14}$aryl)imidazopyridinylene group, an imidazopyrimidinylene group, a $C_1$-$C_{10}$ alkylimidazopyrimidinylene group, a di($C_1$-$C_{10}$ alkyl) imidazopyrimidinylene group, a ($C_6$-$C_{14}$ aryl)imidazopyrimidinylene group, and a di ($C_6$-$C_{14}$ aryl)imidazopyrimidinylene group, but is not limited thereto.

In Formula 3a through 3e, d may be 1, 2, or 3. For example, in Formulae 3a through 3e, $Ar_4$ may be a phenylene group and d may be 1 or 2, but are not limited thereto.

In Formulae 3a through 3e, —N[—$(Ar_5)_e$—$Ar_{15}$][—$(Ar_6)_f$—$Ar_{16}$] of the third substituent may be represented by one of Formulae 6A through 6K.

For example, $R_1$ and $R_8$ in Formulae 3a through 3d may be the first substituent and a in the first substituent may be 0. For example, $R_1$ and $R_8$ in Formulae 3a through 3d may be the first substituent and a in the first substituent may be 0 and $Ar_{11}$ therein may include at least one of a substituted or unsubstituted $C_5$-$C_{14}$aryl group and a substituted or unsubstituted $C_3$-$C_{14}$heteroaryl group. In an implementation, $R_1$ and $R_8$ in Formulae 3a through 3d may be each a phenyl group.

For example, $R_8$ in Formula 3e may be the first substituent and a in the first substituent may be 0. For example, $R_8$ in Formula 3e may be the first substituent a in the first substituent may be 0 and $Ar_{11}$ therein may include at least one of a substituted or unsubstituted $C_5$-$C_{14}$aryl group and a substituted or unsubstituted $C_3$-$C_{14}$heteroaryl group. In an implementation, $R_1$ and $R_8$ in Formula 3e may be each a phenyl group.

In an implementation, the condensed-cyclic compound of Formula 1 may be selected from among Compounds 1 through 25 below, but is not limited thereto:

-continued

Compound 3

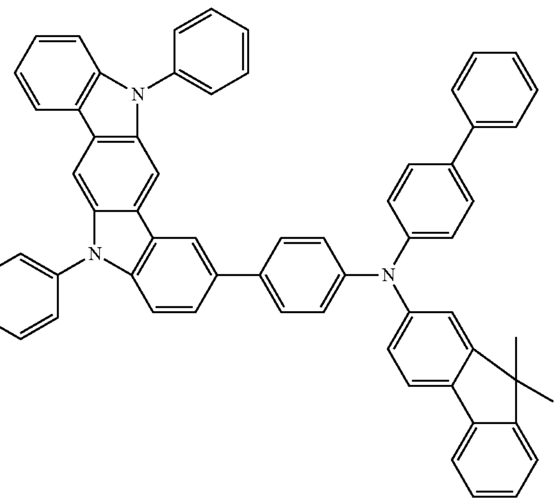

Compound 1

Compound 4

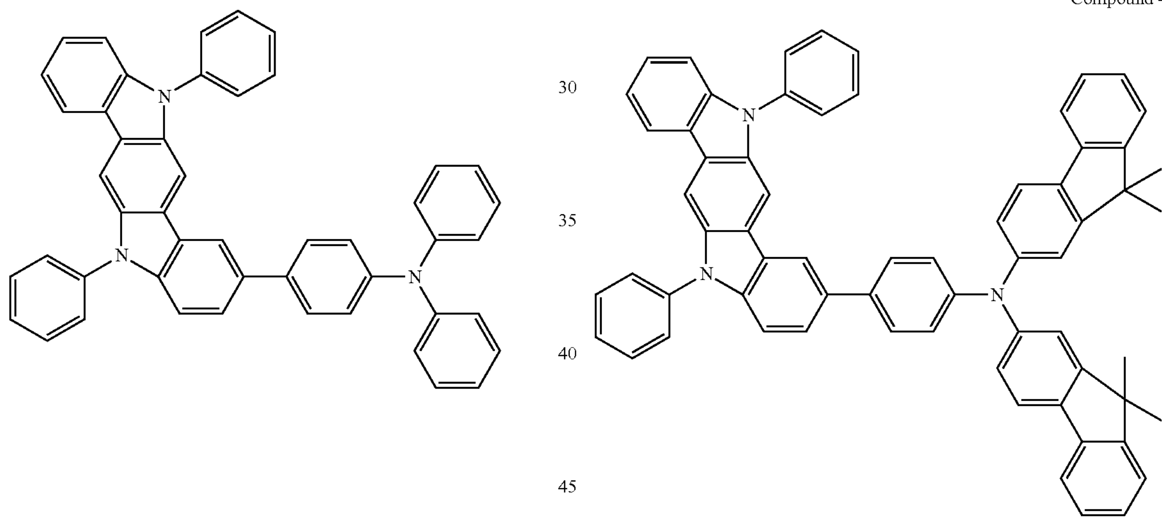

Compound 2

Compound 5

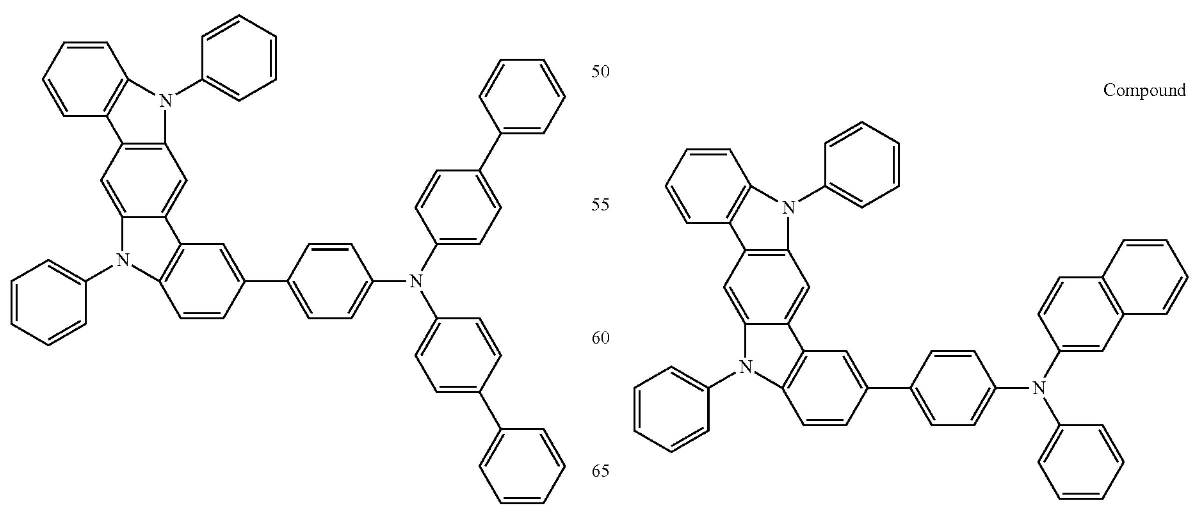

-continued
Compound 6
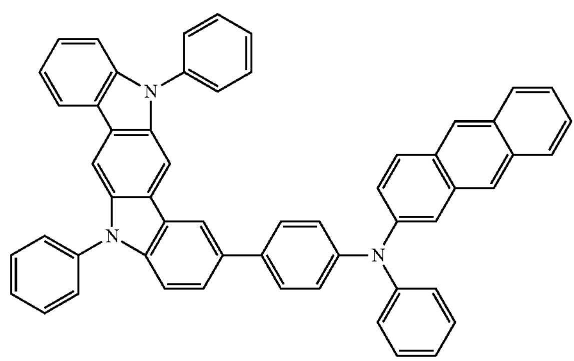
Compound 7
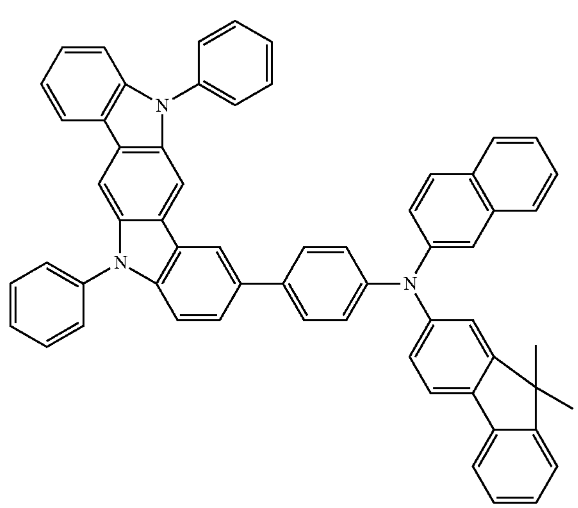
Compound 8
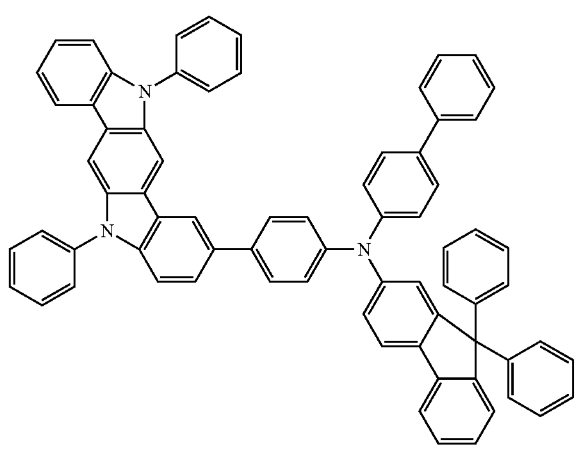
-continued
Compound 9
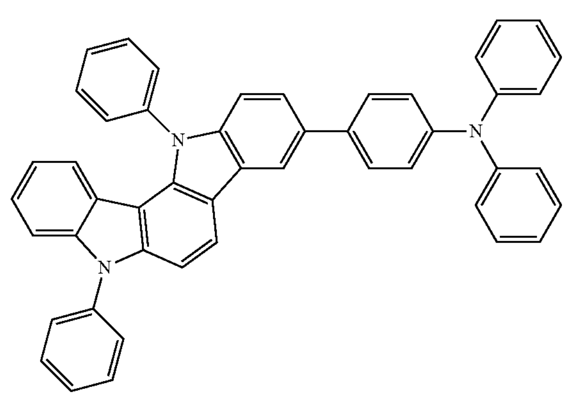
Compound 10
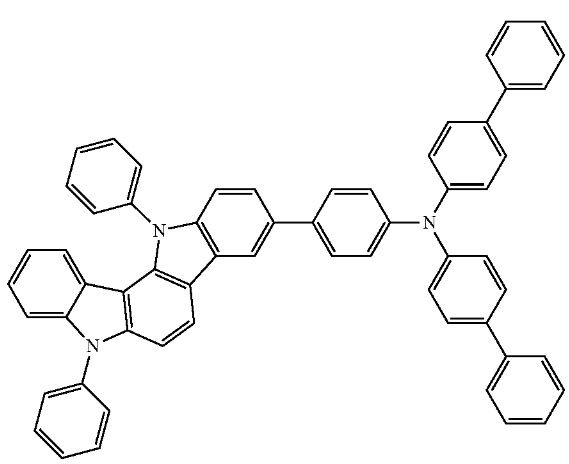
Compound 11
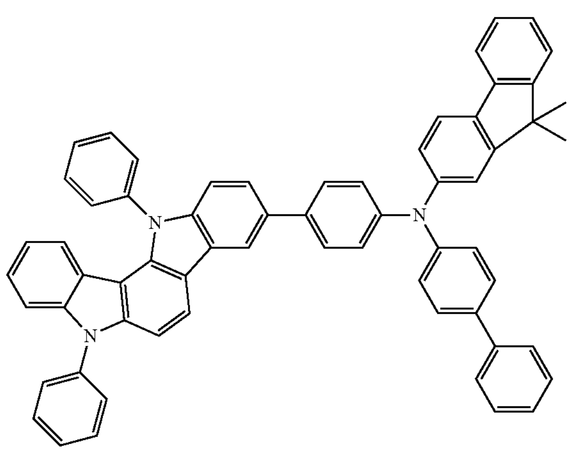

-continued
Compound 12
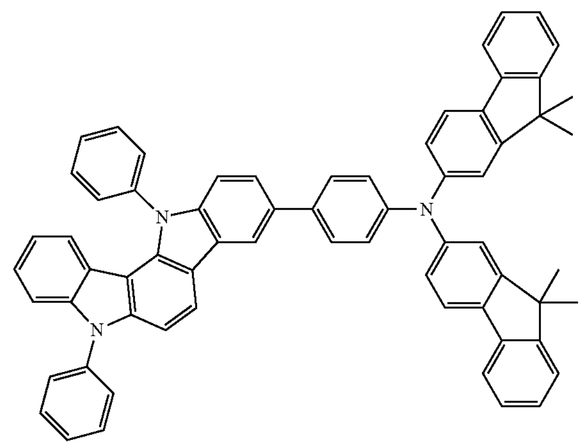
Compound 13
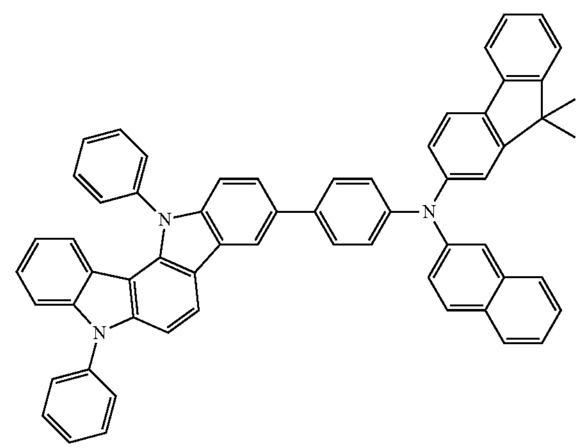
Compound 14
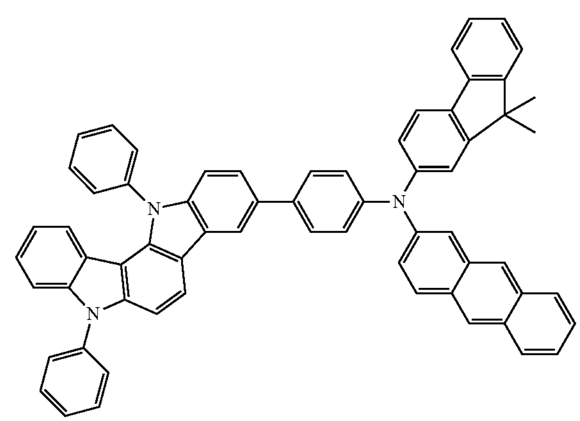
-continued
Compound 15
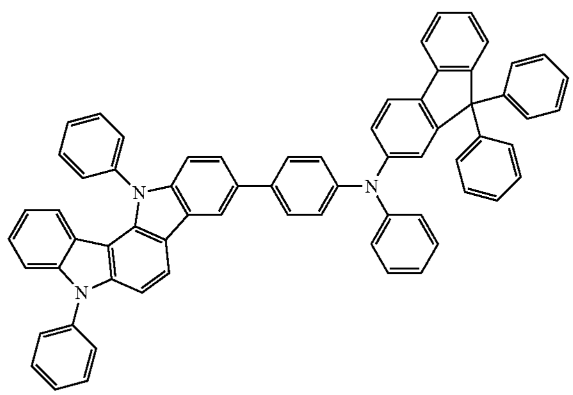
Compound 16
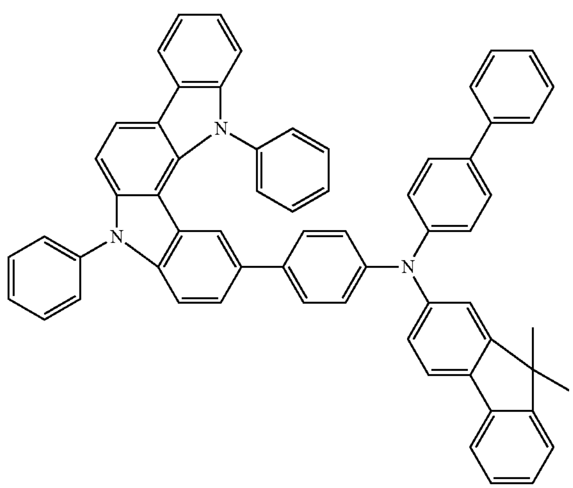
Compound 17
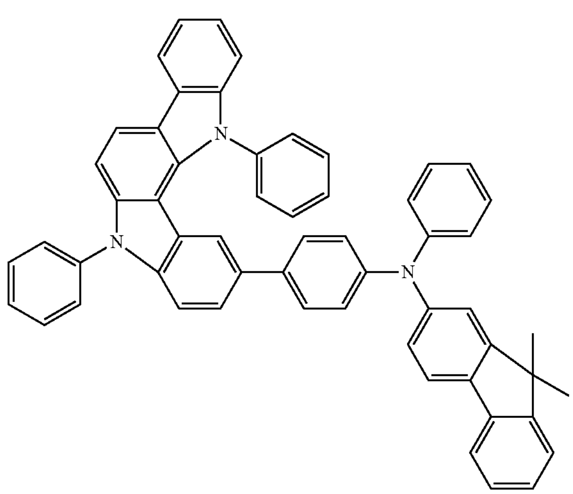

-continued
Compound 18
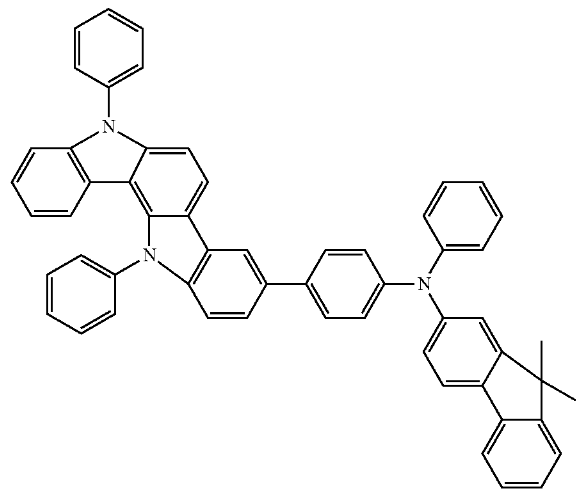
Compound 19
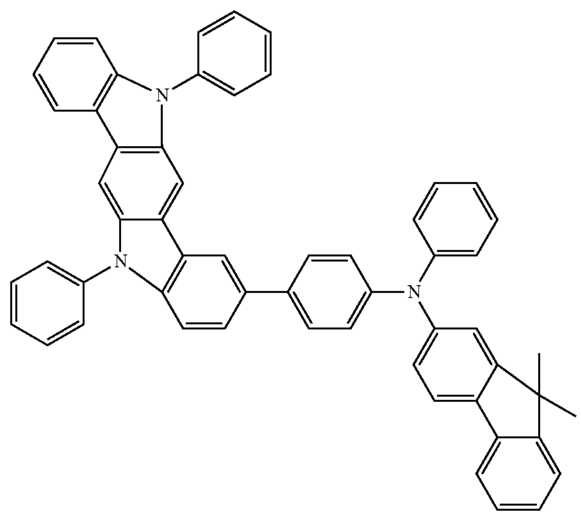
Compound 20
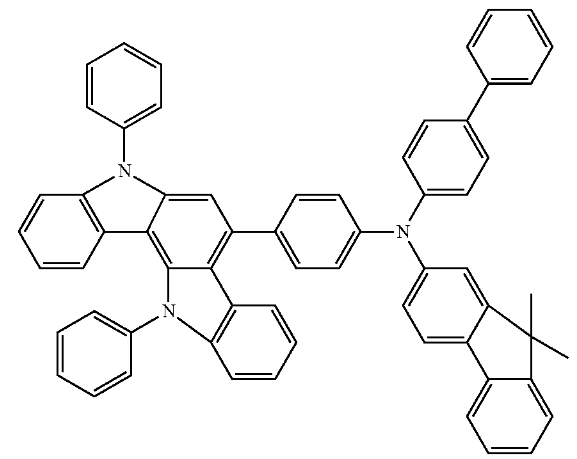
-continued
Compound 21
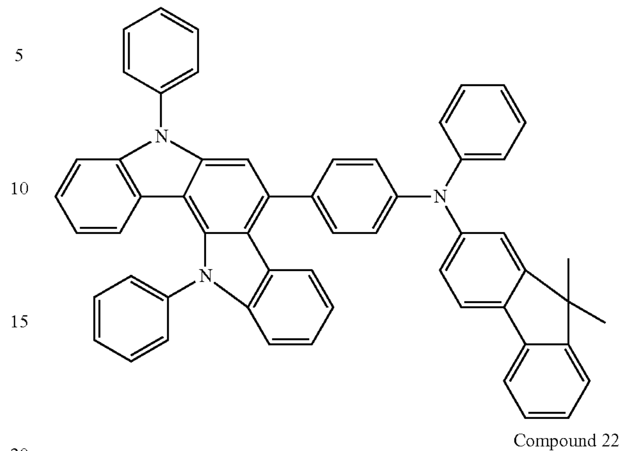
Compound 22
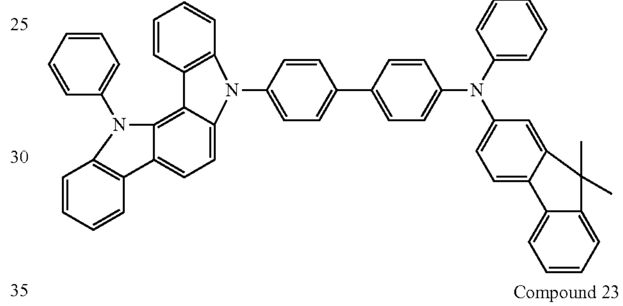
Compound 23
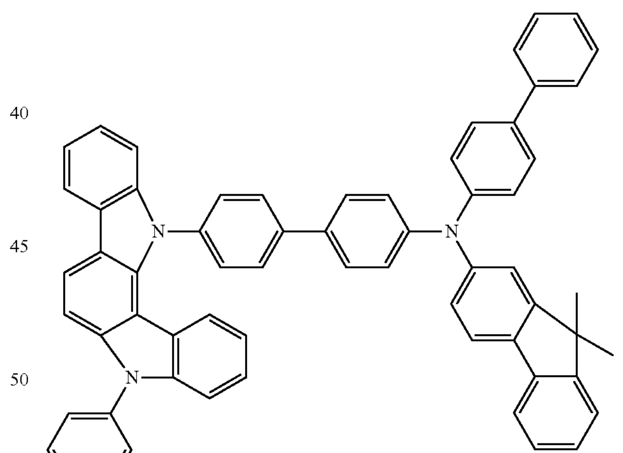
Compound 24
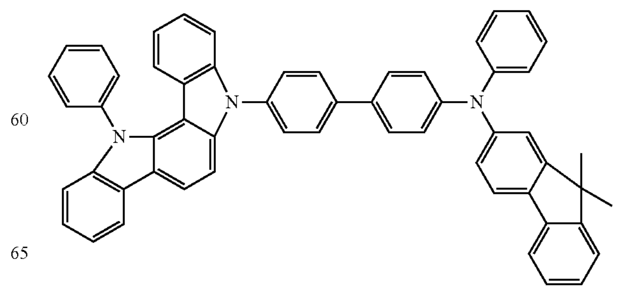

-continued

Compound 25

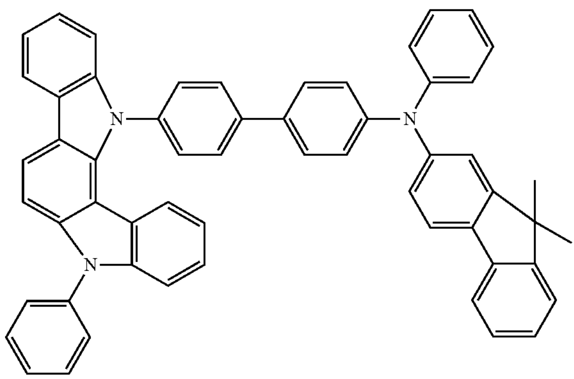

Examples of the unsubstituted $C_1$-$C_{30}$ alkyl group used herein may include methyl, ethyl, propyl, isobutyl, sec-butyl, pentyl, iso-amyl, hexyl, and the like. In the substituted $C_1$-$C_{30}$ alkyl group, at least one hydrogen atom of the unsubstituted $C_1$-$C_{30}$ alkyl group described above may be substituted with a halogen atom, a hydroxyl group, a nitro group, a cyano group, an amino group, an amidino group, hydrazine, hydrazone, a carboxyl group or salts thereof, a sulfonic acid group or salts thereof, a phosphoric acid or salts thereof, a $C_1$-$C_{30}$ alkyl group, a $C_2$-$C_{30}$ alkenyl group, a $C_2$-$C_{30}$ alkynyl group, a $C_6$-$C_{30}$ aryl group, a $C_2$-$C_{20}$ heteroaryl group, —N($Q_1$)($Q_2$), or —Si($Q_3$)($Q_4$)($Q_5$), wherein $Q_1$ through $Q_5$ may each independently be a hydrogen atom, a heavy hydrogen, a $C_1$-$C_{30}$ alkyl group, a $C_2$-$C_{30}$ alkenyl group, a $C_2$-$C_{30}$ alkynyl group, a $C_6$-$C_{30}$ aryl group, and a $C_2$-$C_{20}$ heteroaryl group. The substituted or unsubstituted $C_1$-$C_{30}$ alkylene group may be a divalent linking group having the same structure as the substituted or unsubstituted $C_1$-$C_{30}$ alkyl group described above.

The unsubstituted $C_1$-$C_{30}$ alkoxy group may be a group represented by —OA, wherein A is an unsubstituted $C_1$-$C_{30}$ alkyl group described above. Examples of the unsubstituted $C_1$-$C_{30}$ alkoxy group may include a methoxy group, an ethoxy group, and an isopropyloxy group. At least one of the hydrogen atoms in the alkoxy group may be substituted with the substituents described above in conjunction with the substituted $C_1$-$C_{30}$ alkyl group.

The unsubstituted $C_2$-$C_{30}$ alkenyl group may be a hydrocarbon chain having a carbon-carbon double bond in the center or at a terminal of the unsubstituted $C_2$-$C_{30}$ alkyl group. Examples of the alkenyl group may include an ethenyl group, a propenyl group, a butenyl group, and the like. At least one hydrogen atom in the unsubstituted $C_2$-$C_{30}$ alkenyl group may be substituted with the substituents described in conjunction with the substituted $C_1$-$C_{30}$ alkyl group. The substituted or unsubstituted $C_2$-$C_{30}$ alkenylene group may be a divalent linking group having the same structure as the substituted or unsubstituted $C_2$-$C_{30}$ alkenyl group described above.

The unsubstituted $C_2$-$C_{30}$ alkynyl group may be an alkyl group having at least one carbon-carbon triple bond in a center or at a terminal of the $C_2$-$C_{30}$ alkyl group. Examples of the unsubstituted $C_2$-$C_{20}$ alkynyl group may include ethynyl, propynyl, and the like. At least one hydrogen atom in the alkynyl group may be substituted with the substituents described above in conjunction with the $C_1$-$C_{30}$ alkyl group.

The unsubstituted $C_5$-$C_{30}$ aryl group may be a monovalent group having a carbocyclic aromatic system having 5 to 30 carbon atoms including at least one aromatic ring. The unsubstituted $C_5$-$C_{30}$ arylene group may be a bivalent group having a carbocyclic aromatic system having 5 to 30 carbon atoms including at least one aromatic ring. When the aryl group and the arylene group have at least two rings, they may be fused to each other. At least one hydrogen atom in the aryl group and the arylene group may be substituted with the substituents described above in conjunction with the $C_1$-$C_{30}$ alkyl group.

Examples of the unsubstituted $C_5$-$C_{30}$ aryl group may include a phenyl group, a pentarenyl group, an indenyl group, a naphtyl group, an anthracenyl group, an azulenyl group, a heptalenyl group, an acenaphthylenyl group, a phenalenyl group, a fluorenyl group, an anthraquinolyl group, an anthryl group, a phenanthryl group, a triphenylenyl group, a pyrenyl group, a chrysenyl group, a picenyl group, a perylenyl group, a pentaphenyl group, a pentacenyl group, a tetraphenylenyl group, a hexaphenyl group, hexacenyl group, a rubicenyl group, a coronenyl group, a trinaphthylenyl group, a heptaphenyl group, a heptacenyl group, a pyranthrenyl group, and an ovalenyl group. Examples of the substituted $C_5$-$C_{30}$ aryl group may be inferred based on those of the unsubstituted $C_5$-$C_{30}$ aryl group and the substituted $C_1$-$C_{30}$ alkyl group described above. Examples of the substituted or unsubstituted $C_5$-$C_{30}$ arylene group may be inferred based on examples of the substituted or unsubstituted $C_5$-$C_{30}$ aryl group.

The unsubstituted $C_3$-$C_{30}$ heteroaryl group may be a monovalent group having at least one aromatic ring having at least one heteroatoms of N, O, P, and S, wherein the other ring atoms of the aromatic ring are all carbon atoms. The unsubstituted $C_3$-$C_{30}$ heteroarylene group may be a divalent group having at least one aromatic ring having at least one of the heteroatoms of N, O, P, and S, wherein the other ring atoms of the aromatic ring are all carbon atoms. In this regard, when the heteroaryl group and the heteroarylene group have at least two rings, they may be fused to each other. At least one hydrogen atom in the heteroaryl group and the heteroarylene group may be substituted with the substituents described above in conjunction with the $C_1$-$C_{30}$ alkyl group.

Examples of the unsubstituted $C_3$-$C_{30}$ heteroaryl group may include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, and an imidazopyrimidinyl group. Examples of the unsubstituted $C_3$-$C_{30}$ heteroarylene group may be inferred based on examples of the substituted or unsubstituted $C_3$-$C_{30}$ arylene group.

The condensed-cyclic compound of Formula 1 may be synthesized by using organic synthesis. A method of synthesizing the condensed-cyclic compound may be inferred by one of ordinary skill in the art based on a later-described embodiment.

Since the luminescent efficiency improvement layer 18 including the condensed-cyclic compound of Formula 1 described above may have a high refractive index, an OLED including the luminescent efficiency improvement layer 18 may have excellent luminescent efficiency, particularly external luminescent efficiency. For example, the luminescent efficiency improvement layer 18 may have a refractive index of about 1.7 or more. In an implementation, the luminescent efficiency improvement layer 18 may have a refractive index of about 1.7 to about 2.5. In an implementation, the luminescent efficiency improvement layer 18 may have a refractive index of about 1.8 to about 2.5, with respect to light in the visible light wavelength range (e.g., about 380 nm to about 780 nm or light having a wavelength of about 630 nm). For example, Compounds 1 and 3 may have refractive indices of about 1.975 and about 2.301, respectively, with respect to the light having the wavelength of about 630 nm.

Since an OLED may generally have a structure in which a plurality of layers formed of various materials are stacked, at least a part of the light generated in the organic layer may not be emitted outside of the OLED by total reflection, but may rather be dissipated within the OLED while the light passes through the layers. In an OLED having low external luminescent efficiency, the total luminescent efficiency of the OLED may be reduced even if conversion efficiency of light is high in the organic layer. However, the luminescent efficiency improvement layer 18 may improve external luminescent efficiency by constructive interference while light generated in the organic layer 15 passes through the second electrode 17. Thus, luminescent efficiency of the OLED 10 according to the present embodiment may be significantly improved.

As illustrated in FIG. 1, the light-efficiency-improvement layer 18 may be disposed on the second surface 17B of the second electrode 17. However, various layers may be further disposed between the luminescent efficiency improvement layer 18 and the second electrode 17. For example, even though not illustrated in FIG. 1, a sealing layer may further be formed on the luminescent efficiency improvement layer 18 in order to seal the OLED 10, and various modifications may be applied thereto.

Figure 2:
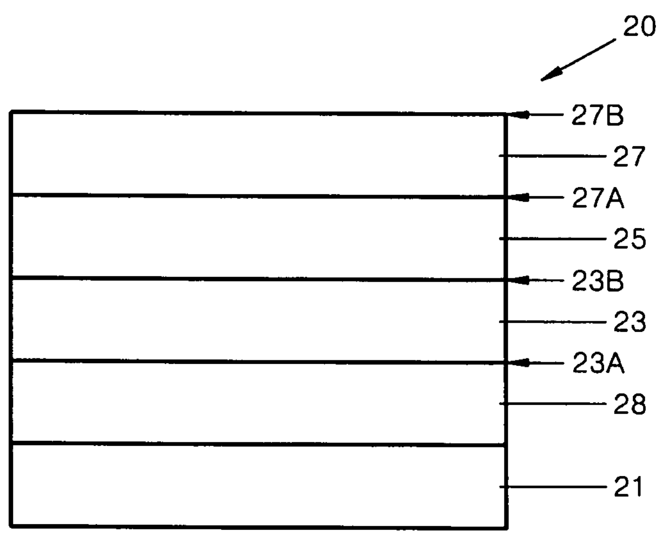
FIG. 2 illustrates a schematic sectional view of an OLED according to another embodiment.

FIG. 2 illustrates a schematic sectional view of an OLED 20 according to another embodiment. Referring to FIG. 2, the OLED 20 according to the present embodiment may include a substrate 21, a luminescent efficiency improvement layer 28, a first electrode 23, an organic layer 25, and a second electrode 27, which are sequentially stacked in this order. The first electrode 23 may have a surface 23B adjacent to the organic layer 25 and a second surface 23A opposite to the first surface 23B. The second electrode 27 May have a first surface 27A adjacent to the organic layer 25 and a second surface 27B opposite to the first surface 27A. The luminescent efficiency improvement layer 28 may be disposed below the second surface 23A of the first electrode 23. The first electrode 23 may be a transmission electrode, and the second electrode 27 may be a reflective electrode. Light generated in the organic layer 25 may be transmitted out of the OLED 20 through the first electrode 23 and the luminescent efficiency improvement layer 28. Detailed description of each of the layers constituting the OLED 20 refer to what has been described above. Since the luminescent efficiency improvement layer 28 including the condensed-cyclic compound of Formula 1 may have a high refractive index, the light generated in the organic layer 25 may be efficiently transmitted out of the OLED by the constructive interference effect. Thus, luminescent efficiency of the OLED 20 may be improved.

Figure 3:
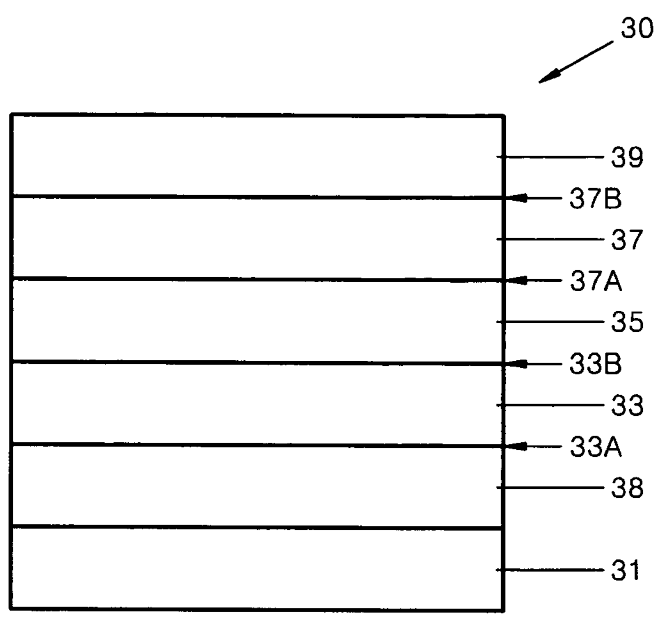
FIG. 3 illustrates a schematic sectional view of an OLED according to yet another embodiment.

FIG. 3 illustrates a schematic sectional view of an OLED 30 according to another embodiment. Referring to FIG. 3, the OLED 30 according to the present embodiment may include a substrate 31, a first luminescent efficiency improvement layer 38, a first electrode 33, an organic layer 35, a second electrode 37, and a second luminescent efficiency improvement layer 39, which are sequentially stacked in this order. The first electrode 33 may have a first surface 33B adjacent to the organic layer 35 and a second surface 33A opposite to the first surface 33B. The second electrode 37 may have a first surface 37A adjacent to the organic layer 35 and a second surface 37B opposite to the first surface 37A. The first luminescent efficiency improvement layer 38 may be disposed on the second surface 33A of the first electrode 33 and the second luminescent efficiency improvement layer 39 may be disposed on the second surface 37B of the second electrode 37. In the OLED 30, the first electrode 31 and the second electrode 37 may be transmission electrodes. Light generated in the organic layer 35 may pass through the first electrode 33 and the first luminescent efficiency improvement layer 38 and the second electrode 37 and the second luminescent efficiency improvement layer 39, before being transmitted out of the OLED 30. Detailed description of each of the layers constituting the OLED 30 refers to what has been described above. Since each of the first luminescent efficiency improvement layer 38 and the second luminescent efficiency improvement layer 39 having the condensed-cyclic compound of Formula 1 may have a high refractive index, the light generated in the organic layer 35 may be efficiently transmitted out of the OLED 30 according to the constructive interference effect. Thus, luminescent efficiency of the OLED 30 may be improved.

The organic layer of the OLED according an embodiment may be patterned according to R, G, and B pixels. Thus, the organic layer may include a red organic layer, a green organic layer, and a blue organic layer.

The luminescent efficiency improvement layer including the condensed-cyclic compound of Formula 1 may be formed as a common layer with respect to the R, G, and B pixels. The luminescent efficiency improvement layer as a common layer may have a thickness of about 500 to about 800 Å, for example, about 600 to about 700 Å. Maintaining the thickness of the luminescent efficiency improvement layer at about 500 to about 800 Å may help ensure that excellent luminescent efficiency is obtained.

Alternatively, the luminescent efficiency improvement layer may include at least one of a luminescent efficiency improvement layer-R, a luminescent efficiency improvement layer-G and a luminescent efficiency improvement layer-B. That is, the luminescent efficiency improvement layer may be patterned to correspond to the R, G, and B pixels.

The term “luminescent efficiency improvement layer-R” used herein is a luminescent efficiency improvement layer formed in a region corresponding to the R pixel.

The term “luminescent efficiency improvement layer-G” used herein is a luminescent efficiency improvement layer formed in a region corresponding to the G pixel.

The term “luminescent efficiency improvement layer-B” used herein is a luminescent efficiency improvement layer formed in a region corresponding to the B pixel.

The thicknesses of the luminescent efficiency improvement layer-R, the luminescent efficiency improvement layer-G, and the luminescent efficiency improvement layer-B may be the same or different.

Hereinafter, one or more embodiments will be described in detail with reference to the following examples. These examples are not intended to limit the purpose and scope of the one or more embodiments.

EXAMPLE

Synthesis Example 1

Synthesis of Compound 1

Compound F was synthesized through Reaction Scheme 1a below:

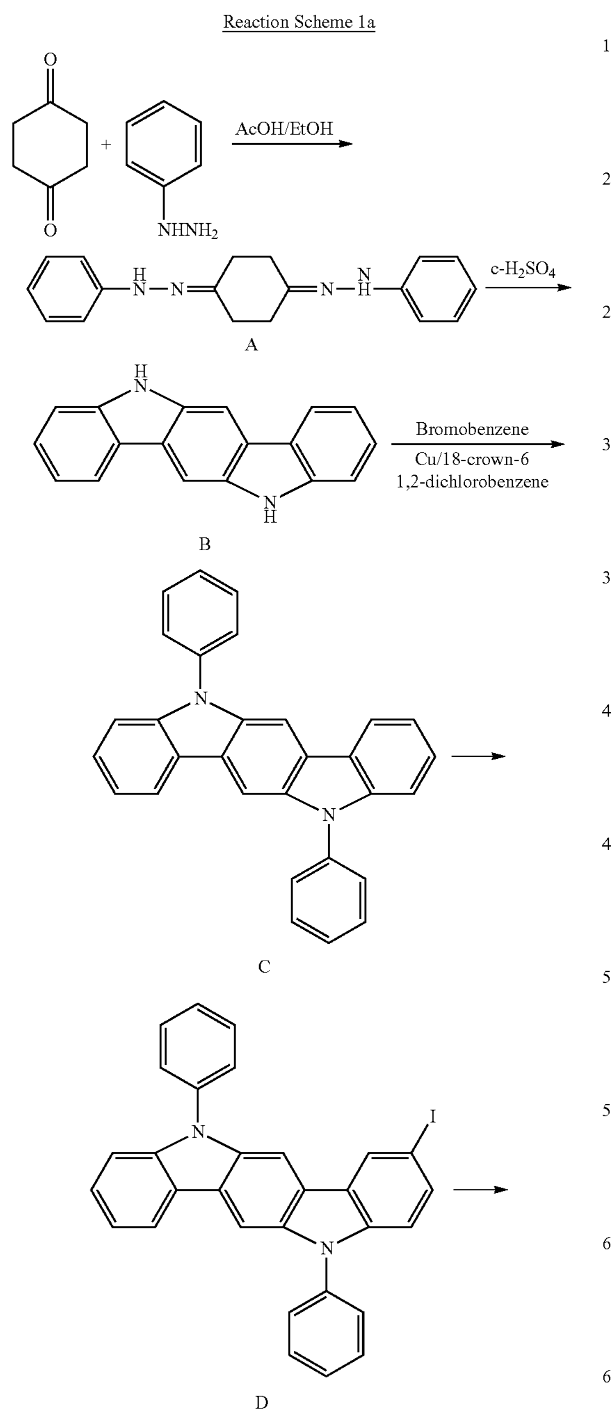

-continued

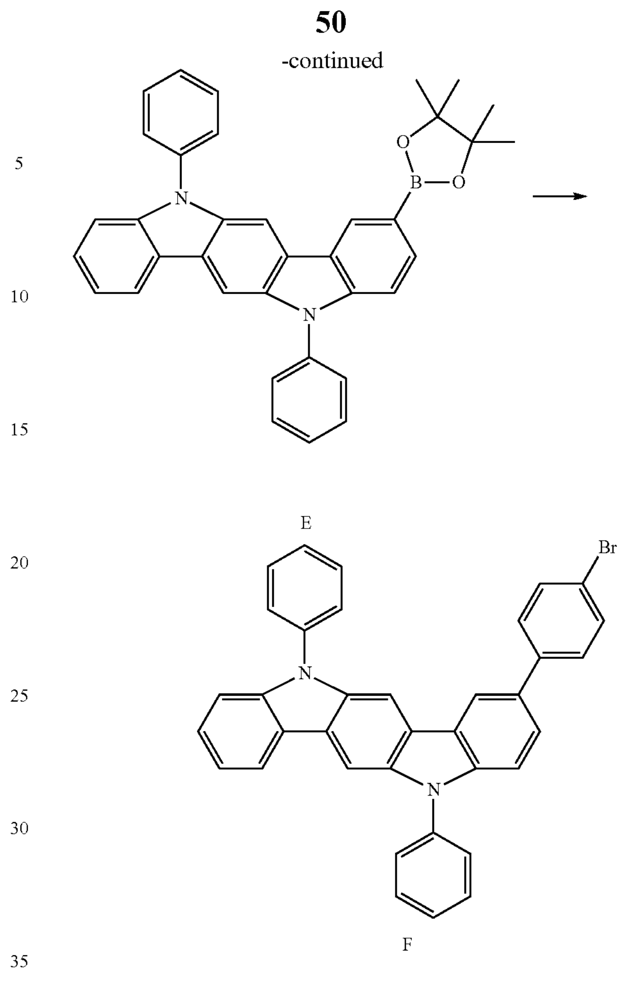

Synthesis of Compound B 34.9 g (0.31 mole) of 1,4-cyclohexanedione, 90 g (0.62 mole) of phenylhydrazin.HCl, and 1 mL of acetic acid were put into a 1 L round flask, and 600 mL of ethanol was added thereto. The resulting mixture was heated at 50° C. for 1 hour and cooled to room temperature. The resulting solid was filtered, washed with ethanol several times, and dried in a vacuum to obtain 73 g of Compound A in pink with a yield of 80%. 600 mL of acetic acid and 120 mL of sulfuric acid were mixed in a 5 L-round flask, and heat generated from the mixture was cooled in an ice bath. 217.5 g (0.74 mole) of Compound A was added into the mixture and vigorously stirred at 0° C. for 10 minutes. The mixture was removed from the ice bath and then further stirred at room temperature for 10 minutes. The round flask containing the mixture was equipped in a heating mantle and then heated. When a reaction began to take place around 45° C., the heating was stopped, while the mixture was continuously stirred. When the reaction mixture was stabilized, the mixture was slowly cooled to room temperature and stirred at room temperature. The resulting solid product was filtered, washed with acetic acid, water and then ethyl ether, and dried in a vacuum to obtain 51 g of Compound B with a yield of 26.7%.

$^{1}$H NMR (300 MHz, DMSO-d6) δ 11.01 (2H), 8.19 (2H), 8.10 (2H), 7.45 (2H), 7.36 (2H), 7.12 (2H)

Synthesis of Compound C 6.2 g (0.2 eq.) of 18-crown-6, 129.5 g (8 eq.) of $K_2CO_3$, 29.8 g (4 eq.) of Cu, and 99.4 g (3 eq.) of bromobenzene were added into a mixture of 30 g (0.117 mol) of Compound B in 1 L of 1,2-dichlorobenzene and heated to 180° C. The mixture was reacted at 170~180° C. for 2 days, cooled to room temperature, and then filtered through a silica gel pad while washing with toluene several times. After the resulting filtrate was concentrated, methanol was added thereto to precipitate a solid. Then, the solid precipitate was filtered. The resulting product was filtered while washing with ethyl acetate, and dried in a vacuum to obtain 14.4 g of Compound C with a yield of 21.7%.

$^1$H NMR (300 MHz, DMSO) δ 8.31 (2H), 8.21 (2H), 7.90 (6H), 7.72 (4H), 7.40 (4H), 7.24 (2H)

Synthesis of Compound D 4.08 g (10 mmol) of Compound C was added to 100 ml of 80% acetic acid, and then 1.357 g (5.35 mmol) of iodine and 0.333 g (1.46 mmol) of periodinic acid ($H_5IO_6$) in a solid state were added to the mixture. Then the mixture was stirred at 80° C. for 2 hours in a nitrogen atmosphere. After completion of the reaction, the reaction product was extracted three times with 50 mL of dichloromethane to collect organic layers. The organic layers were dried over magnesium sulfate, and the remaining solvent was evaporated. The residue was isolated and purified using silica gel column chromatography to obtain 6.14 g of Compound D with a yield of 87%.

$^1$H NMR (300 MHz, DMSO) δ 8.28 (1H), 8.25 (1H), 8.06 (1H), 7.90-7.86 (6H), 7.71 (4H), 7.38-7.32 (4H), 7.21 (2H)

Synthesis of Compound F 5.34 g (10 mmol) of Compound D, 0.5 mmol of [1,1'-bis(diphenylphosphino)ferrocene]dichloropalladium(II) ($PdCl_2$(dppf), 2.66 g (10.5 mmol) of bis(pinacolate)diboron, and 3.92 g (20 mmol) of potassium acetate were added into 200 mL of dimethylsulfoxide (DMSO) and stirred at 90° C. under a nitrogen atmosphere for 6 hours. The resulting mixture was cooled to room temperature and added to 300 mL of water until a white precipitate was obtained. The precipitate was filtered, while washing with water several times, to obtain a solid compound. The solid compound was dried under a reduced pressure to obtain 4.65 g of Compound E with a yield of 87%. Compound E was dissolved in 150 mL of toluene, and 2.46 g (8.7 mmol) of 1-bromo-4-iodobenzene and 200 mg (2 mol %) of tetrakis(triphenylphosphane)palladium(0) ($Pd(PPh_3)_4$) were added thereto. Then, 100 mL of an aqueous solution of 2.4 g (17.4 mmol) of $K_2CO_3$ was added into the mixture and reacted at 80° C. for 6 hours. After completion of the reaction, the reaction product was extracted three times with 50 mL of dichloromethane to collect organic layers. The organic layers were dried over magnesium sulfate, and the remaining solvent was evaporated. The residue was isolated and purified using silica gel column chromatography to obtain 6.2 g of Compound F with a yield of 79%.

$^1$H NMR (300 MHz, DMSO) δ 8.25 (1H), 8.17 (1H), 8.10 (1H), 7.99 (2H), 7.95-7.87 (5H), 7.83-7.80 (6H), 7.76-7.72 (4H), 7.70-7.58 (3H)

Synthesis of Compound 1

Compound 1 was synthesized through Reaction Scheme 1b below:

Reaction Scheme 1b

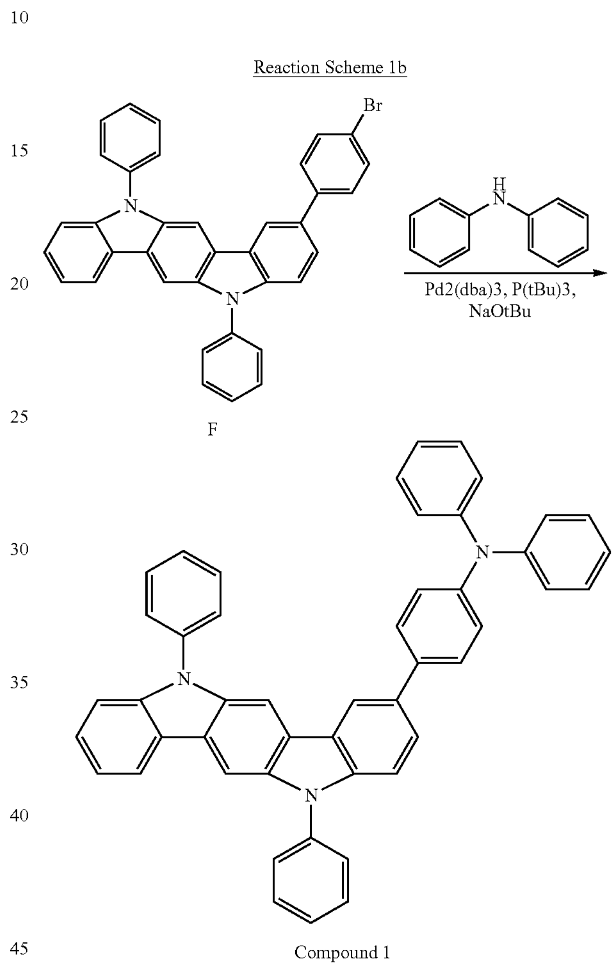

3 g (5.32 mmol) of Compound F and 1.08 g (6.38 mmol) of diphenylamine were dissolved in toluene, and 97.4 mg (0.11 mmol) of tris(dibenzylideneacetone)dipalladium ($Pd_2(dba)_3$) and 22 mg (0.11 mmol) of tri(t-butyl)phosphine were added into the solution in a nitrogen atmosphere. Then, 1.62 g (15.96 mmol) of NaOtBu was added into the mixture and stirred at 80° C. for 4 hours. The resulting mixture was cooled to room temperature and then extracted three times with dichloromethane to collect organic layers. The organic layers were dried over magnesium sulfate, and the remaining solvent was evaporated. The residue was isolated and purified using silica gel column chromatography to obtain 2.64 g of Compound 1 with a yield of 76%.

$^1$H NMR (300 MHz, DMSO) δ 8.25 (1H), 8.14 (2H), 8.06 (1H), 7.97 (2H), 7.88-7.79 (11H), 7.73 (2H), 7.58-7.41 (6H), 7.37 (2H), 7.24 (2H), 7.08-6.96 (4H)

Synthesis Example 2

Synthesis of Compound 3

Compound 3 was synthesized through Reaction Scheme 2 below:

Reaction Scheme 2

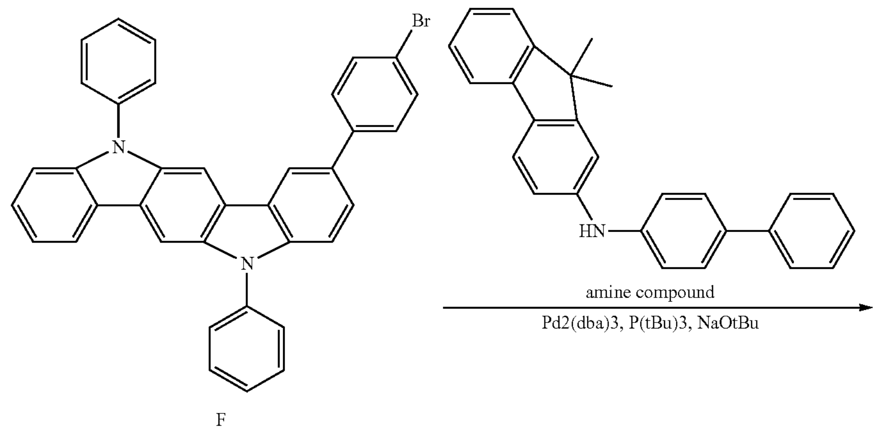

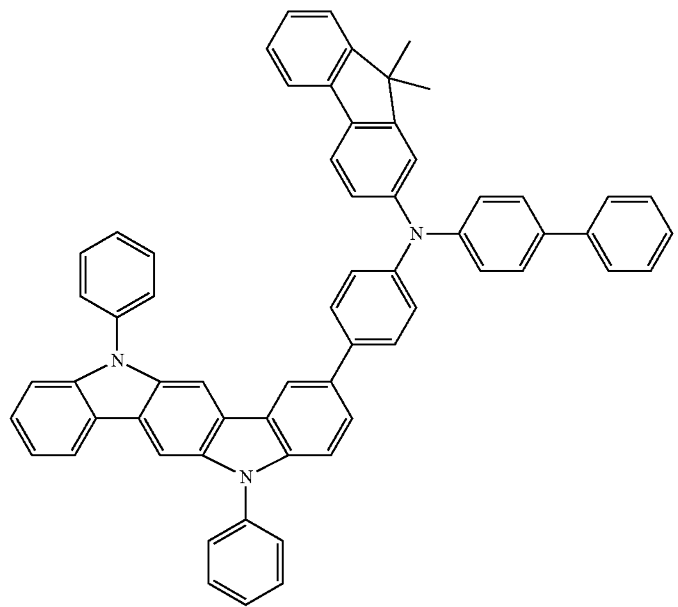

Compound 3

3 g (5.32 mmol) of Compound F and 2.31 g (6.38 mmol) of the amine compound were dissolved in toluene, and 97.4 mg (0.11 mmol) of tris(dibenzylideneacetone)dipalladium(0) ($Pd_2(dba)_3$) and 22 mg (0.11 mmol) of tri(t-butyl)phosphine were added into the solution in a nitrogen atmosphere. Then, 1.62 g (15.96 mmol) of NaOtBu was added into the mixture and stirred at 80° C. for 4 hours. The resulting mixture was cooled to room temperature and then extracted three times with dichloromethane to collect organic layers. The organic layers were dried over magnesium sulfate, and the remaining solvent was evaporated. The residue was isolated and purified using silica gel column chromatography to obtain 3.11 g of Compound 3 with a yield of 69%.

$^1$H NMR (300 MHz, DMSO) δ 8.34 (1H), 8.27 (1H), 8.09-8.03 (4H), 7.98-7.94 (3H), 7.90-7.88 (3H), 7.82-7.78 (14H), 7.73-7.70 (5H), 7.58-7.50 (2H), 7.23-7.08 (6H), 1.78 (6H)

Example 1

Then, ITO(70 Å)/Ag(1000 Å)/ITO(70 Å) layers as an anode were disposed on a glass substrate. Then, m-MTDATA was vacuum-deposited on the anode to form a HIL having a thickness of 200 Å and then α-NPD was vacuum-deposited on the HIL to form a HTL having a thickness of 10 Å. 97 wt % of DSA as a host and 3 wt % of TBPe as a dopant were deposited on the HTL to form an EML with a thickness of 150 Å. Alq3 was vacuum-deposited on the EML to form an ETL having a thickness of 200 Å. LiF was vacuum-deposited on the ETL to form an EIL having a thickness of 10 Å and Mg:Ag was vacuum-deposited on the EIL to form a cathode having a thickness of 200 Å. Then, Compound 1 was vacuum-deposited on the cathode to form a luminescent efficiency improvement layer.

Example 2

An OLED was manufactured in the same manner as in Example 1, except that Compound 3, instead of Compound 1, was used to form the luminescent efficiency improvement layer.

Comparative Example 1

An OLED was manufactured in the same manner as in Example 1, except that $Alq_3$ (having a refractive index of 1.685 with respect to light with a wavelength of about 630 nm) was used instead of Compound 1 as the material used to form the luminescent efficiency improvement layer.

Evaluation Example

Luminescent efficiencies of the OLEDs manufactured in Examples 1 and 2 and Comparative Example 1 were measured using a PR650 (Spectroscan) Source Measurement Unit (available from PhotoResearch, Inc.). The results are shown in Table 1 below.

TABLE 1

| | luminescent efficiency improvement layer compound | Luminescent efficiency (cd/A) |
|---|---|---|
| Example 1 | Compound 1 | 4.6 |
| Example 2 | Compound 3 | 4.8 |
| Comparative Example 1 | $Alq_3$ | 3.2 |

Referring to Table 1, the OLEDs of Examples 1 and 2 were found to have improved external luminescent efficiencies, as compared to the OLED of Comparative Example 1.

The OLED including the luminescent efficiency improvement layer containing the condensed-cyclic compound represented by Formula 1 may have high luminescent efficiency.

Luminescent efficiency of the OLED of an embodiment may be increased by increasing the external luminescent efficiency thereof, independent of the luminescent efficiency in the organic layers (e.g., internal luminescent efficiency is high).

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light-emitting device, comprising:

a substrate;

a first electrode on the substrate, the first electrode including a first surface and a second surface opposite to the first surface;

an organic layer on the first electrode, the organic layer being adjacent to the first surface of the first electrode;

a second electrode on the organic layer, the second electrode including a first surface adjacent to the organic layer and a second surface opposite to the first surface; and a luminescent efficiency improvement layer on at least one of the second surface of the first electrode and the second surface of the second electrode, the luminescent efficiency improvement layer including a condensed-cyclic compound represented by Formula 1, below:

Formula 1

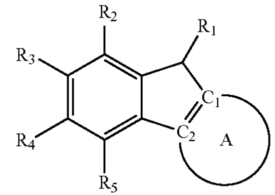

wherein, in Formula 1, ring A is represented by Formula 2 or 3 below:

Formula 2

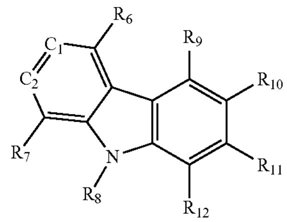

Formula 3

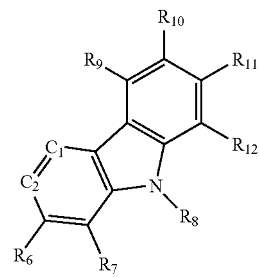

wherein, in Formulae 1 to 3, $R_1$ through $R_{12}$ are each independently a hydrogen atom, a heavy hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a first substituent represented by $—(Ar_1)_a—Ar_{11}$, a second substituent represented by $—N[—(Ar_2)_b—Ar_{12}][—(Ar_3)_c—Ar_{13}]$, or a third substituent represented by $—(Ar_4)_d—N[—(Ar_5)_e—Ar_{15}][—(Ar_6)_f—Ar_{16}]$;

$Ar_1$ through $Ar_6$, among the first to third substituents, are each independently a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, or a substituted or unsubstituted $C_3$-$C_{30}$ heteroarylene group;

$Ar_{11}$, $Ar_{12}$, $Ar_{13}$, $Ar_{15}$, and $Ar_{16}$, among the first to third substituents, are each independently a hydrogen atom, a heavy hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_5$-$C_{30}$ aryl group, or a substituted or unsubstituted $C_3$-$C_{30}$ heteroaryl group;

a, b, c, e, and f are each independently an integer from 0 to 10;

d is an integer from 1 to 10; and a groups of $Ar_1$ in the group of —$(Ar_1)_a$—$Ar_{11}$ are identical to or different from each other; b groups of $Ar_2$ in the group of —$(Ar_2)_b$—$Ar_{12}$ are identical to or different from each other; c groups of $Ar_3$ in the group of —$(Ar_3)_c$—$Ar_{13}$ are identical to or different from each other; e groups of $Ar_5$ in the group of —$(Ar_5)_e$—$Ar_{15}$ are identical to or different from each other; and f groups of $Ar_6$ in the group of —$(Ar_6)_f$—$Ar_{16}$ are identical to or different from each other.

2. The organic light-emitting device as claimed in claim 1, wherein $Ar_1$ through $Ar_6$ are each independently a substituted or unsubstituted $C_5$-$C_{14}$ arylene group or a substituted or unsubstituted $C_3$-$C_{14}$ heteroarylene group.

3. The organic light-emitting device as claimed in claim 1, wherein $Ar_1$ through $Ar_6$ are each independently a phenylene group, a $C_1$-$C_{10}$ alkylphenylene group, a di($C_1$-$C_{10}$ alkyl) phenylene group, a ($C_6$-$C_{14}$ aryl)phenylene group, a di($C_6$-$C_{14}$ aryl)phenylene group, a carbazolylene group, a $C_1$-$C_{10}$ alkylcarbazolylene group, a di($C_1$-$C_{10}$ alkyl)carbazolylene group, a $C_6$-$C_{14}$ arylcarbazolylene group, a di($C_6$-$C_{14}$ aryl) carbazolylene group, a fluorenylene group, a $C_1$-$C_{10}$ alkylfluorenylene group, a di($C_1$-$C_{10}$ alkyl)fluorenylene group, a ($C_6$-$C_{14}$ aryl)fluorenylene group, a di($C_6$-$C_{14}$ aryl)fluorenylene group, a naphthylene group, a $C_1$-$C_{10}$ alkylnaphthylene group, a di($C_1$-$C_{10}$ alkyl)naphthylene group, a ($C_6$-$C_{14}$ aryl)naphthylene group, a di($C_6$-$C_{14}$ aryl)naphthylene group, an anthrylene group, a $C_1$-$C_{10}$ alkylanthrylene group, a di($C_1$-$C_{10}$ alkyl)nthrylene group, a ($C_6$-$C_{14}$ aryl)nthrylene group, a di($C_6$-$C_{14}$ aryl)nthrylene group, a pyridinylene group, a $C_1$-$C_{10}$ alkylpyridinylene group, a di($C_1$-$C_{10}$ alkyl)pyridinylene group, a ($C_6$-$C_{14}$ aryl)pyridinylene group, a di($C_6$-$C_{14}$ aryl)pyridinylene group, a quinolinylene group, a $C_1$-$C_{10}$ alkylquinolinylene group, a di($C_1$-$C_{10}$ alkyl)quinolinylene group, a ($C_6$-$C_{14}$ aryl)quinolinylene group, a di($C_6$-$C_{14}$ aryl) quinolinylene group, a benzoimidazolylene group, a $C_1$-$C_{10}$ to alkylbenzoimidazolylene group, a di($C_1$-$C_{10}$ alkyl)benzoimidazolylene group, a ($C_6$-$C_{14}$ aryl)benzoimidazolylene group, a di($C_6$-$C_{14}$ aryl)benzoimidazolylene group, an imidazopyridinylene group, a $C_1$-$C_{10}$ alkylimidazopyridinylene group, a di($C_1$-$C_{10}$ alkyl)imidazopyridinylene group, a ($C_6$-$C_{14}$ aryl)imidazopyridinylene group, a di($C_6$-$C_{14}$aryl)imidazopyridinylene group, an imidazopyrimidinylene group, a $C_1$-$C_{10}$ alkylimidazopyrimidinylene group, a di($C_1$-$C_{10}$ alkyl) imidazopyrimidinylene group, a ($C_6$-$C_{14}$ aryl)imidazopyrimidinylene group, or a di($C_6$-$C_{14}$ aryl)imidazopyrimidinylene group.

4. The organic light-emitting device as claimed in claim 1, wherein $Ar_{1l}$, $Ar_{12}$, $Ar_{13}$, $Ar_{15}$, and $Ar_{16}$ are each independently a hydrogen atom, a heavy hydrogen, a halogen atom, a hydroxyl group, a cyano group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_5$-$C_{14}$ aryl group, or a substituted or unsubstituted $C_3$-$C_{14}$ heteroaryl group.

5. The organic light-emitting device as claimed in claim 1, wherein $Ar_{11}$, $Ar_{12}$, $Ar_{13}$, $Ar_{15}$, and $Ar_{16}$ are each independently a hydrogen atom, a heavy hydrogen, a halogen atom, a hydroxyl group, a cyano group, a methyl group, an ethyl group, a propyl group, a butyl group, a pentyl group, an ethenyl group, a propenyl group, a butenyl group, a pentenyl group, an acetyl group, a methoxy group, an ethoxy group, a propoxy group, a butoxy group, a pentoxy group, a phenyl group, a $C_1$-$C_{10}$ alkyl phenyl group, a di($C_1$-$C_{10}$ alkyl)phenyl group, a ($C_6$-$C_{14}$ aryl)phenyl group, a di($C_6$-$C_{14}$ aryl)phenyl group, a carbazolyl group, a $C_1$-$C_{10}$alkylcarbazolyl group, a di($C_1$-$C_{10}$ alkyl)carbazolyl group, a $C_6$-$C_{14}$ arylcarbazolyl group, a di($C_6$-$C_{14}$ aryl)carbazolyl group, a fluorenyl group, a $C_1$-$C_{10}$ alkylfluorenyl group, a di($C_1$-$C_{10}$ alkyl)fluorenyl group, a ($C_6$-$C_{14}$ aryl)fluorenyl group, a di($C_6$-$C_{14}$ aryl)fluorenyl group, a naphthyl group, a $C_1$-$C_{10}$ alkylnaphthyl group, a di($C_1$-$C_{10}$ alkyl)naphthyl group, a ($C_6$-$C_{14}$ aryl)naphthyl group, a di($C_6$-$C_{14}$ aryl)naphthyl group, an anthryl group, a $C_1$-$C_{10}$ alkylanthryl group, a di($C_1$-$C_{10}$ alkyl)anthryl group, a ($C_6$-$C_{14}$ aryl)anthryl group, a di($C_6$-$C_{14}$ aryl)anthryl group, a pyridinyl group, a $C_1$-$C_{10}$ alkylpyridinyl group, a di($C_1$-$C_{10}$ alkyl)pyridinyl group, a ($C_6$-$C_{14}$ aryl)pyridinyl group, a di($C_6$-$C_{14}$ aryl)pyridinyl group, a quinolinyl group, a $C_1$-$C_{10}$ alkylquinolinyl group, a di($C_1$-$C_{10}$ alkyl)quinolinyl group, a ($C_6$-$C_{14}$ aryl)quinolinyl group, a di($C_6$-$C_{14}$ aryl)quinolinyl group, a benzoimidazolyl group, a $C_1$-$C_{10}$ alkylbenzoimidazolyl group, a di($C_1$-$C_{10}$ alkyl)benzoimidazolyl group, a ($C_6$-$C_{14}$ aryl)benzoimidazolyl group, a di($C_6$-$C_{14}$ aryl)benzoimidazolyl group, an imidazopyridinyl group, a $C_1$-$C_{10}$ alkylimidazopyridinyl group, a di($C_1$-$C_{10}$ alkyl) imidazopyridinyl group, a ($C_6$-$C_{14}$ aryl) imidazopyridinyl group, a di($C_6$-$C_{14}$ aryl) imidazopyridinyl group, an imidazopyrimidinyl group, a $C_1$-$C_{10}$ alkylimidazopyrimidinyl group, a di($C_1$-$C_{10}$ alkyl) imidazopyrimidinyl group, a ($C_6$-$C_{14}$ aryl) imidazopyrimidinyl group, or a di($C_6$-$C_{14}$ aryl) imidazopyrimidinyl group.

6. The organic light-emitting device as claimed in claim 1, wherein $Ar_{11}$, $Ar_{12}$, $Ar_{13}$, $Ar_{15}$, and $Ar_{16}$ are each independently represented by any one of Formulae 4A through 4G below:

Formula 4A

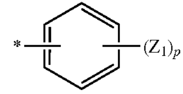

Formula 4B

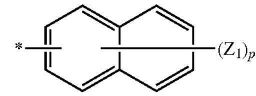

Formula 4C

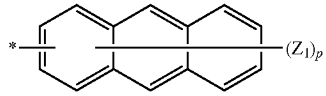

Formula 4D

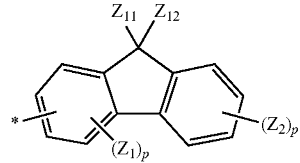

-continued

Formula 4E

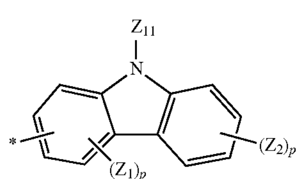

Formula 4F

Formula 4G wherein, in Formulae 4A to 4G:

$Z_1$, $Z_2$, $Z_{11}$, and $Z_{12}$ are each independently a hydrogen atom, a heavy hydrogen, a $C_1$-$C_{10}$ alkyl group, a $C_1$-$C_{10}$ alkoxy group, or a $C_6$-$C_{14}$ aryl group;

p and q are each independently an integer from 1 to 8; and

* denotes a binding site with $Ar_1$, $Ar_2$, $Ar_3$, $Ar_5$, or $Ar_6$.

7. The organic light-emitting device as claimed in claim 1, wherein $Ar_{11}$, $Ar_{12}$, $Ar_{13}$, $Ar_{15}$, and $Ar_{16}$ are each independently represented by any one of Formulae 5A through 5E below:

Formula 5A

Formula 5B

Formula 5C

Formula 5D

Formula 5E

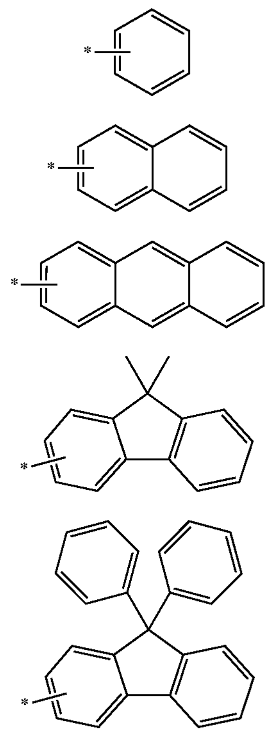

wherein * is a binding site with $Ar_1$, $Ar_2$, $Ar_3$, $Ar_5$, or $Ar_6$.

8. The organic light-emitting device as claimed in claim 1, wherein a, b, c, e, and f are each independently 0, 1, 2, or 3.

9. The organic light-emitting device as claimed in claim 1, wherein d is 1, 2, or 3.

10. The organic light-emitting device as claimed in claim 1, wherein the second substituent and —N[—$(Ar_5)_e$—$Ar_{15}$][—$(Ar_6)_f$—$Ar_{16}$] of the third substituent are each independently represented by any one of Formulae 6A through 6K below:

Formula 6A

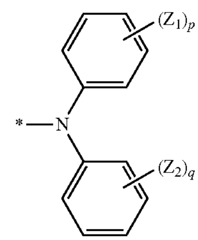

Formula 6B

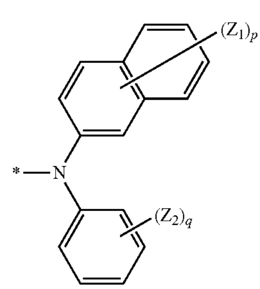

Formula 6C

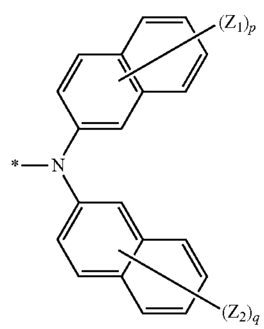

Formula 6D

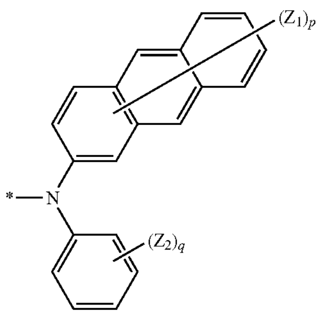

Formula 6E

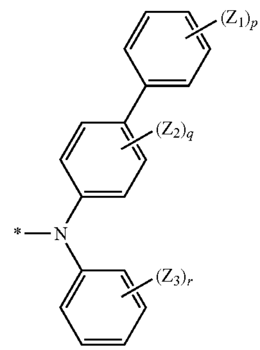

-continued

Formula 6F

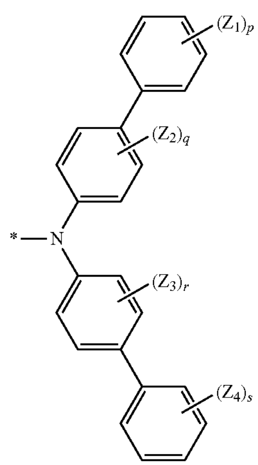

Formula 6G

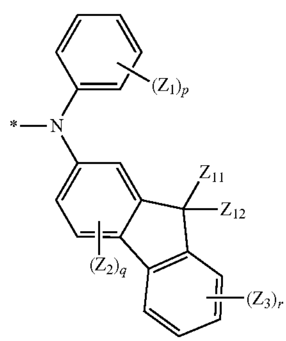

Formula 6H

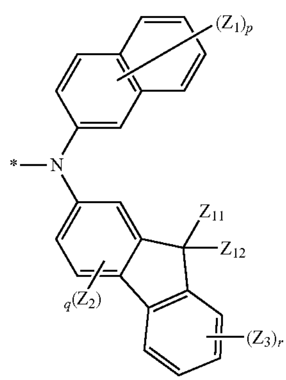

Formula 6I

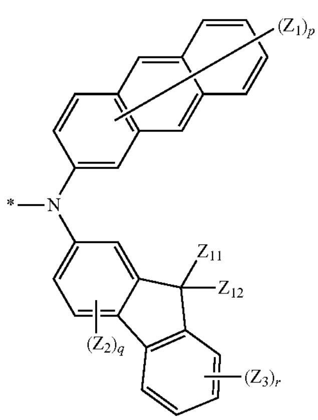

-continued

Formula 6J

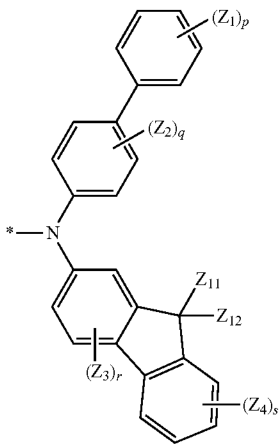

Formula 6K

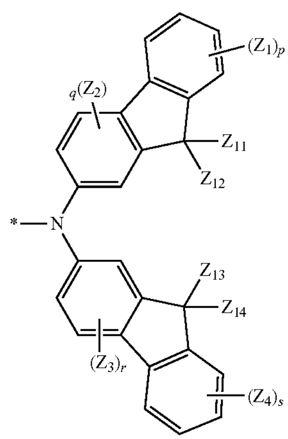

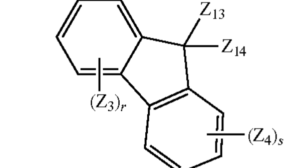

wherein, in Formulae 6A to 6K:

$Z_1$ through $Z_4$ and $Z_{11}$ through $Z_{14}$ are each independently a hydrogen atom, a heavy hydrogen, a $C_1$-$C_{10}$ alkyl group, a $C_1$-$C_{10}$ alkoxy group, or a $C_6$-$C_{14}$ aryl group;

p, q, r, and s are each independently an integer from 1 to 8; and

* denotes a binding site with $Ar_4$ or with a ring atom of a backbone of Formula 1.

11. The organic light-emitting device as claimed in claim 1, wherein $R_1$ through $R_{12}$ are each independently a hydrogen atom, a heavy hydrogen, a halogen atom, a hydroxyl group, a cyano group, the first substituent, the second substituent, or the third substituent; a in the first substituent is 0; b and c in the second substituent are each independently 0 or 1; d in the third substituent is 1 or 2, e and fin the third substituent are each independently 0 or 1; $Ar_2$ through $Ar_6$ in the first to third substituents are each independently a substituted or unsubstituted $C_5$-$C_{14}$ arylene group or a substituted or unsubstituted $C_3$-$C_{14}$ heteroarylene group; and $Ar_{1l}$, $Ar_{12}$, $Ar_{13}$, $Ar_{15}$, and $Ar_{16}$ in the first to third substituents are each independently a hydrogen atom, a heavy hydrogen, halogen atom, a hydroxyl group, a cyano group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_5$-$C_{14}$ aryl group, or a substituted or unsubstituted $C_3$-$C_{14}$ heteroaryl group.

12. The organic light-emitting device as claimed in claim 1, wherein $R_1$ through $R_{12}$ are each independently a hydrogen atom, a heavy hydrogen, a halogen atom, a hydroxyl group, a cyano group, the first substituent, the second substituent, or the third substituent; a in the first substituent is 0; b and c in the second substituent are each independently 0 or 1; d in the third substituent is 1 or 2, and e and fin the third substituent are each independently 0 or 1; $Ar_2$ through $Ar_6$ in the first to third substituents are each independently a phenylene group, a $C_1$-$C_{10}$ alkylphenylene group, a di($C_1$-$C_{10}$ alkyl)phenylene group, a ($C_6$-$C_{14}$aryl)phenylene group, a di($C_6$-$C_{14}$aryl)phenylene group, a carbazolylene group, a $C_1$-$C_{10}$alkylcarbazolylene group, a di($C_1$-$C_{10}$alkyl)carbazolylene group, a $C_6$-$C_{14}$arylcarbazolylene group, a di($C_6$-$C_{14}$aryl)carbazolylene group, a fluorenylene group, a $C_1$-$C_{10}$alkylfluorenylene group, a di($C_1$-$C_{10}$alkyl)fluorenylene group, a ($C_6$-$C_{14}$aryl)fluorenylene group, a di($C_6$-$C_{14}$aryl)fluorenylene group, a naphthylene group, a $C_1$-$C_{10}$alkylnaphthylene group, a di($C_1$-$C_{10}$alkyl)naphthylene group, a ($C_6$-$C_{14}$aryl)naphthylene group, a di($C_6$-$C_{14}$aryl)naphthylene group, an anthrylene group, a $C_1$-$C_{10}$alkylanthrylene group, a di($C_1$-$C_{10}$alkyl)nthrylene group, a ($C_6$-$C_{14}$aryl)nthrylene group, a di($C_6$-$C_{14}$aryl) nthrylene group, a pyridinylene group, a $C_1$-$C_{10}$alkylpyridinylene group, a di($C_1$-$C_{10}$alkyl)pyridinylene group, a ($C_6$-$C_{14}$aryl)pyridinylene group, a di($C_6$-$C_{14}$aryl)pyridinylene group, a quinolinylene group, a $C_1$-$C_{10}$alkylquinolinylene group, a di($C_1$-$C_{10}$alkyl)quinolinylene group, a ($C_6$-$C_{14}$aryl)quinolinylene group, a di($C_6$-$C_{14}$aryl)quinolinylene group, a benzoimidazolylene group, a $C_1$-$C_{10}$ alkylbenzoimidazolylene group, a di($C_1$-$C_{10}$alkyl) benzoimidazolylene group, a ($C_6$-$C_{14}$aryl)benzoimidazolylene group, a di($C_6$-$C_{14}$aryl)benzoimidazolylene group, an imidazopyridinylene group, a $C_1$-$C_{10}$alkylimidazopyridinylene group, a di($C_1$-$C_{10}$alkyl) imidazopyridinylene group, a ($C_6$-$C_{14}$aryl) imidazopyridinylene group, a di($C_6$-$C_{14}$aryl) imidazopyridinylene group, an imidazopyrimidinylene group, a $C_1$-$C_{10}$alkylimidazopyrimidinylene group, a di($C_1$-$C_{10}$alkyl) imidazopyrimidinylene group, a ($C_6$-$C_{14}$aryl) imidazopyrimidinylene group, or a di($C_6$-$C_{14}$aryl) imidazopyrimidinylene group; $Ar_{11}$, $Ar_{12}$, $Ar_{13}$, $Ar_{15}$, and $Ar_{16}$ in the first to third substituents are each independently a hydrogen atom, a heavy hydrogen, a halogen atom, a hydroxyl group, a cyano group, a methyl group, an ethyl group, a propyl group, a butyl group, a pentyl group, an ethenyl group, a propenyl group, a butenyl group, a pentenyl group, an acetyl group, a methoxy group, an ethoxy group, a propoxy group, a butoxy group, a pentoxy group, a phenyl group, $C_1$-$C_{10}$alkyla phenyl group, a di($C_1$-$C_{10}$alkyl)phenyl group, a ($C_6$-$C_{14}$aryl)phenyl group, a di($C_6$-$C_{14}$aryl) phenyl group, a carbazolyl group, a $C_1$-$C_{10}$alkylcarbazolyl group, a di($C_1$-$C_{10}$alkyl)carbazolyl group, a $C_6$-$C_{14}$arylcarbazolyl group, a di($C_6$-$C_{14}$aryl)carbazolyl group, a fluorenyl group, a $C_1$-$C_{10}$alkylfluorenyl group, di($C_1$-$C_{10}$alkyl)fluorenyl group, a ($C_6$-$C_{14}$aryl)fluorenyl group, a di($C_6$-$C_{14}$aryl)fluorenyl group, a naphthyl group, a $C_1$-$C_{10}$alkylnaphthyl group, a di($C_1$-$C_{10}$alkyl)naphthyl group, a ($C_6$-$C_{14}$aryl)naphthyl group, a di($C_6$-$C_{14}$aryl)naphthyl group, an anthryl group, a $C_1$-$C_{10}$ alkylanthryl group, a di($C_1$-$C_{10}$alkyl)anthryl group, a ($C_6$-$C_{14}$aryl)anthryl group, a di($C_6$-$C_{14}$aryl)anthryl group, a pyridinyl group, a $C_1$-$C_{10}$alkylpyridinyl group, a di($C_1$-$C_{10}$alkyl)pyridinyl group, a ($C_6$-$C_{14}$aryl)pyridinyl group, a di($C_6$-$C_{14}$aryl)pyridinyl group, a quinolinyl group, a $C_1$-$C_{10}$alkylquinolinyl group, a di($C_1$-$C_{10}$alkyl)quinolinyl group, a ($C_6$-$C_{14}$aryl) quinolinyl group, a di($C_6$-$C_{14}$aryl)quinolinyl group, a benzoimidazolyl group, a $C_1$-$C_{10}$alkylbenzoimidazolyl group, a di($C_1$-$C_{10}$alkyl)benzoimidazolyl group, a ($C_6$-$C_{14}$aryl)benzoimidazolyl group, a di($C_6$-$C_{14}$aryl)benzoimidazolyl group, an imidazopyridinyl group, a $C_1$-$C_{10}$alkylimidazopyridinyl group, a di($C_1$-$C_{10}$alkyl) imidazopyridinyl group, a ($C_6$-$C_{14}$aryl) imidazopyridinyl group, a di($C_6$-$C_{14}$aryl) imidazopyridinyl group, an imidazopyrimidinyl group, a $C_1$-$C_{10}$alkylimidazopyrimidinyl group, a di($C_1$-$C_{10}$alkyl) imidazopyrimidinyl group, a ($C_6$-$C_{14}$aryl) imidazopyrimidinyl group, or a di($C_6$-$C_{14}$aryl) imidazopyrimidinyl group.

13. The organic light-emitting device as claimed in claim 1, wherein the condensed-cyclic compound represented by Formula 1 is represented by any one of Formulae 2a through 2d below:

Formula 2a

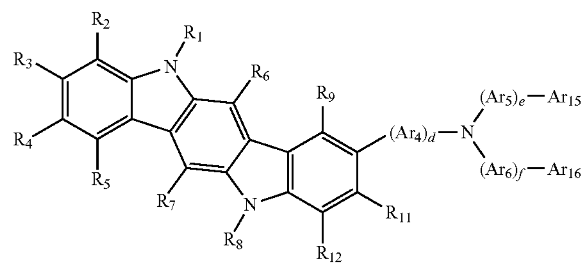

Formula 2b

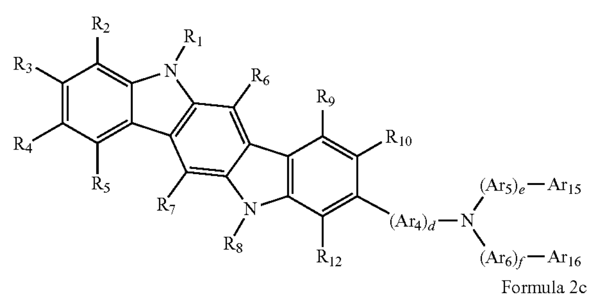

Formula 2c

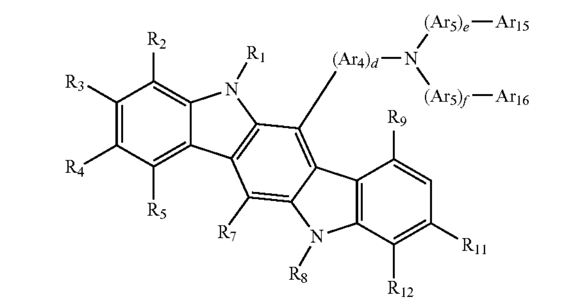

Formula 2d

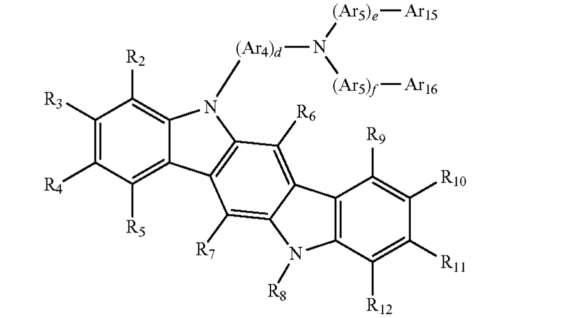

wherein, in Formulae 2a to 2d, $R_1$ through $R_{12}$ are each independently a hydrogen atom, a heavy hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, the first substituent, the second substituent, or the third substituent;

$Ar_1$ through $Ar_6$, among the first to third substituents, are each independently a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, or a substituted or unsubstituted $C_3$-$C_{30}$ heteroarylene group;

$Ar_{11}$, $Ar_{12}$, $Ar_{13}$, $Ar_{15}$, and $Ar_{16}$, among the first to third substituents, are each independently a hydrogen atom, a heavy hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_5$-$C_{30}$ aryl group, or a substituted or unsubstituted $C_3$-$C_{30}$ heteroaryl group;

a, b, c, e, and f are each independently an integer from 0 to 10;

d is an integer from 1 to 10; and a groups of $Ar_1$ in the group of $-(Ar_1)_a-Ar_{11}$ are identical to or different from each other; b groups of $Ar_2$ in the group of $-(Ar_2)_b-Ar_{12}$ are identical to or different from each other; c groups of $Ar_3$ in the group of $-(Ar_3)_c-Ar_{13}$ are identical to or different from each other; e groups of $Ar_5$ in the group of $-(Ar_5)_e-Ar_{15}$ are identical to or different from each other; and f groups of $Ar_6$ in the group of $-(Ar_6)_f-Ar_{16}$ are identical to or different from each other.

14. The organic light-emitting device as claimed in claim 1, wherein the condensed-cyclic compound represented by Formula 1 is represented by any one of Formulae 3a through 3e below:

Formula 3a

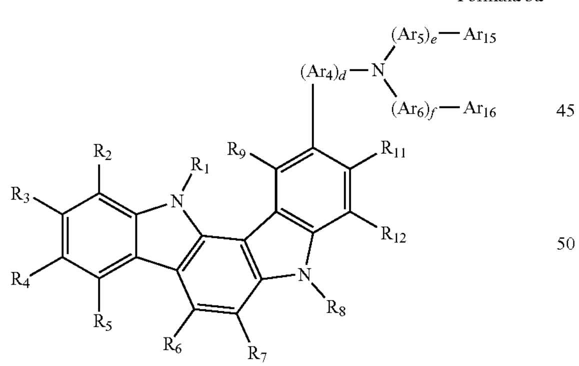

Formula 3b

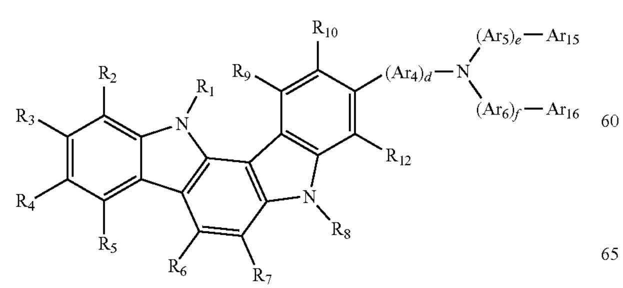

-continued

Formula 3c

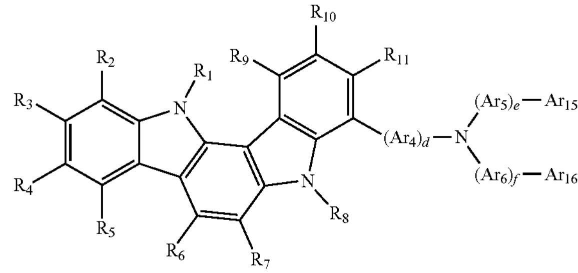

Formula 3d

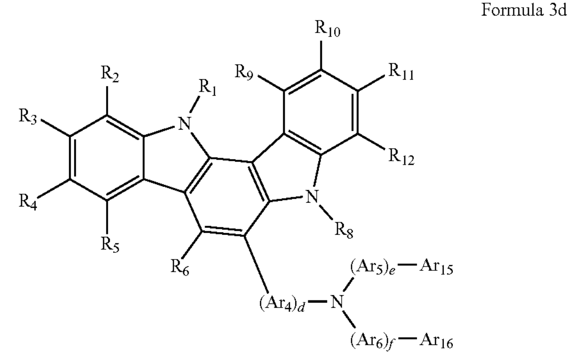

Formula 3e

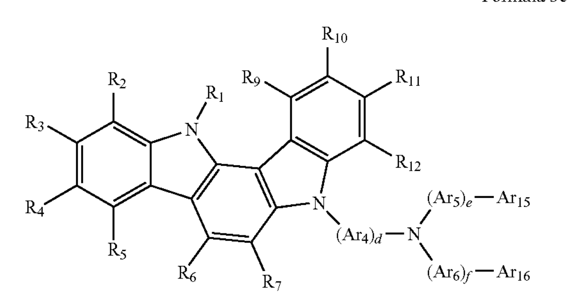

wherein, in Formulae 3a to 3e, $R_1$ through $R_{12}$ are each independently a hydrogen atom, a heavy hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, the first substituent, the second substituent, or the third substituent;

$Ar_1$ through $Ar_6$, among the first to third substituents, are each independently a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, or a substituted or unsubstituted $C_3$-$C_{30}$ heteroarylene group;

$Ar_{11}$, $Ar_{12}$, $Ar_{13}$, $Ar_{15}$, and $Ar_{16}$, among the first to third substituents, are each independently a hydrogen atom, a heavy hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_5$-$C_{30}$ aryl group, or a substituted or unsubstituted $C_3$-$C_{30}$ heteroaryl group;

a, b, c, e, and f are each independently an integer from 0 to 10;

d is an integer from 1 to 10; and a groups of $Ar_1$ in the group of —$(Ar_1)_a$—$Ar_{11}$ are identical to or different from each other; b groups of $Ar_2$ in the group of —$(Ar_2)_b$—$Ar_{12}$ are identical to or different from each other; c groups of $Ar_3$ in the group of —$(Ar_3)_c$—$Ar_{13}$ are identical to or different from each other; e groups of $Ar_5$ in the group of —$(Ar_5)_e$—$Ar_{15}$ are identical to or different from each other; and f groups of $Ar_6$ in the group of —$(Ar_6)_f$—$Ar_{16}$ are identical to or different from each other.

15. The organic light-emitting device as claimed in claim 1, wherein:

the second electrode is a transmission electrode, and the luminescent efficiency improvement layer is disposed over the second surface of the second electrode, the second electrode being between the organic layer and the luminescent efficiency improvement layer.

16. The organic light-emitting device as claimed in claim 1, wherein:

the first electrode is a transmission electrode, and the luminescent efficiency improvement layer is disposed under the second surface of the first electrode, the first electrode being between the organic layer and the luminescent efficiency improvement layer.

17. The organic light-emitting device as claimed in claim 1, wherein:

the first electrode and the second electrode are transmission electrodes, a first luminescent efficiency improvement layer is disposed over the second surface of the second electrode, the second electrode being between the organic layer and the first luminescent efficiency improvement layer, and a second luminescent efficiency improvement layer is disposed under the second surface of the first electrode, the first electrode being between the organic layer and the second luminescent efficiency improvement layer.

18. The organic light-emitting device as claimed in claim 1, wherein:

the organic layer includes red, green, and blue pixels, and the luminescent efficiency improvement layer is a common layer with respect to the red, green, and blue pixels.

19. The organic light-emitting device as claimed in claim 1, wherein:

the organic layer includes red, green, and blue pixels, and the luminescent efficiency improvement layer includes at least one of a luminescent efficiency improvement layer-R in a region corresponding to the red pixel, a luminescent efficiency improvement layer-G in a region corresponding to the green pixel, and a luminescent efficiency improvement layer-B in a region corresponding to the blue pixel.

* * * * *